United States Patent
Newman et al.

(10) Patent No.: US 6,732,640 B1
(45) Date of Patent: May 11, 2004

(54) SCREEN PRINTING FRAME HAVING PRESTRESSING REINFORCEMENT

(76) Inventors: Don Newman, 419 Rices Mill Rd., Wyncote, PA (US) 19095; Thomas A. McKeever, 505 E. Park Dr., Maple Shade, NJ (US) 08052; Michael P. A. Chouinard, 1221 Gilbert Ave., Wilmington, DE (US) 19808

( * ) Notice: Subject to any disclaimer, the term of this patent is extended or adjusted under 35 U.S.C. 154(b) by 0 days.

(21) Appl. No.: 09/680,655

(22) Filed: Oct. 6, 2000

Related U.S. Application Data
(60) Provisional application No. 60/158,220, filed on Oct. 7, 1999.

(51) Int. Cl.⁷ .............................................. B05C 17/06
(52) U.S. Cl. ..................... 101/127.1; 160/379; 38/102.8
(58) Field of Search .................. 101/114, 127, 101/127.1; 38/102.1, 102.3, 102.4, 102.8; 160/379, 380

(56) References Cited

U.S. PATENT DOCUMENTS

| | | | | |
|---|---|---|---|---|
| 2,565,218 A | * | 8/1951 | Freeborn | 101/415.1 |
| 3,167,004 A | | 1/1965 | Miller et al. | 101/127.1 |
| 3,414,994 A | | 12/1968 | Jaccard et al. | 38/102.91 |
| 3,553,862 A | | 1/1971 | Hamu | 38/102.1 |
| 3,608,484 A | * | 9/1971 | Bubley et al. | 101/127.1 |
| 3,908,293 A | | 9/1975 | Newman | 38/102.91 |
| 3,962,805 A | | 6/1976 | Hamu | 38/102.5 |
| 4,345,390 A | | 8/1982 | Newman | 38/102.91 |
| 4,409,749 A | | 10/1983 | Hamu | 38/102.3 |
| 4,430,814 A | | 2/1984 | Wulc | 38/102.91 |
| 4,525,909 A | | 7/1985 | Newman | 29/121.1 |
| 5,018,442 A | | 5/1991 | Hamu | 101/127.1 |
| 5,063,842 A | | 11/1991 | Clarke | 101/127.1 |
| 5,097,761 A | | 3/1992 | Hamu | 101/127.1 |
| 5,127,176 A | | 7/1992 | Newman | 38/102.1 |
| 5,136,797 A | * | 8/1992 | Hildebrandt | 101/127.1 |
| 5,148,745 A | | 9/1992 | Hamu | 101/127.1 |
| 5,255,600 A | | 10/1993 | Hamu | 101/127.1 |
| 5,265,534 A | | 11/1993 | Hamu | 101/127.1 |
| 5,274,934 A | | 1/1994 | Newman, Jr. | 38/102.91 |
| 5,279,221 A | * | 1/1994 | Miller et al. | 101/127.1 |
| 5,377,422 A | | 1/1995 | Newman | 33/620 |
| 5,379,691 A | | 1/1995 | Hamu et al. | 101/127.1 |
| 5,488,901 A | | 2/1996 | Hruska | 101/129 |
| 5,522,148 A | | 6/1996 | Newman | 33/620 |
| 5,819,654 A | * | 10/1998 | Farr | 101/129 |
| 5,913,263 A | | 6/1999 | Hruska | 101/114 |
| 5,937,753 A | | 8/1999 | McKeever | 101/127.1 |

OTHER PUBLICATIONS

"Newman Roller Frame® Instruction and Educational Manual"; 1986 by Stretch Devices, Inc.; 38 pages.

\* cited by examiner

*Primary Examiner*—Ren Yan
(74) *Attorney, Agent, or Firm*—Drinker Biddle & Reath LLP

(57) ABSTRACT

A frame for supporting the screen of a screen printing machine having elongated frame members coupled together each providing support for an edge of the screen. The frame further includes a reinforcing member supported by the frame to extend in intimate proximity along at least a portion of at least one of the frame members to provide a prestress and/or camber of the frame member. The reinforcing member may include a cable extending within an interior of the frame member. The reinforcing member may also include an elongated secondary member affixed to the frame member while the frame member and secondary member are subjected to an applied condition imposing differential strains on confronting surfaces of the frame member and secondary member.

29 Claims, 23 Drawing Sheets

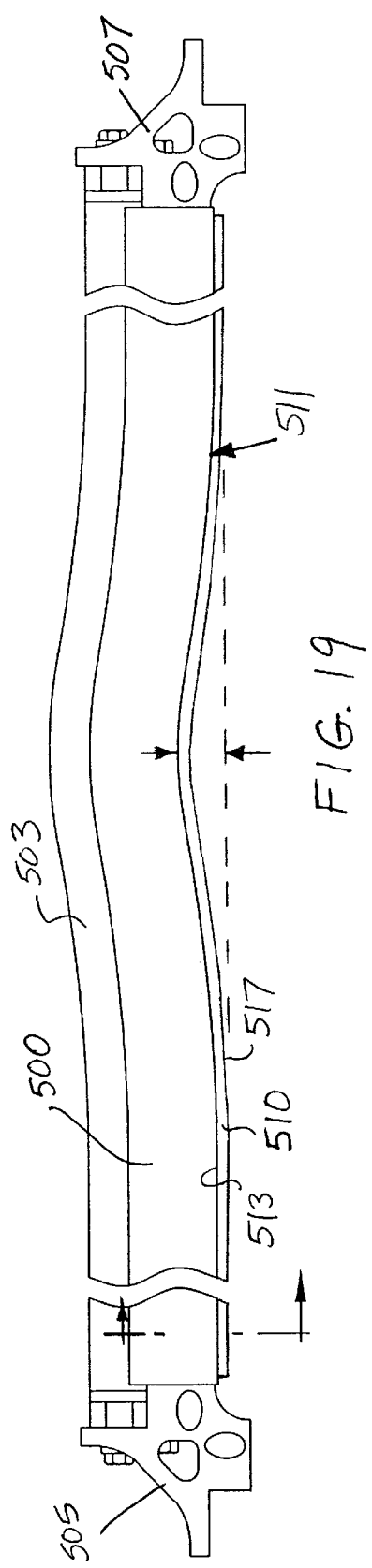
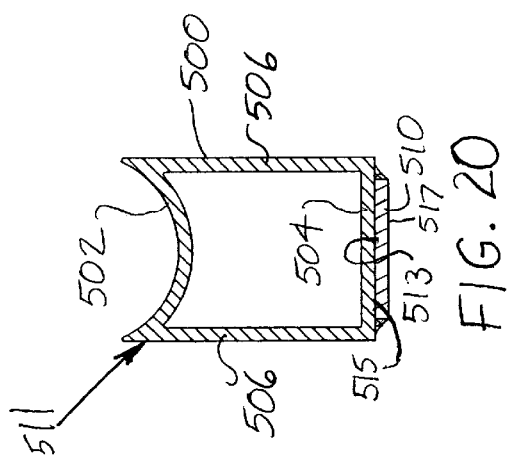

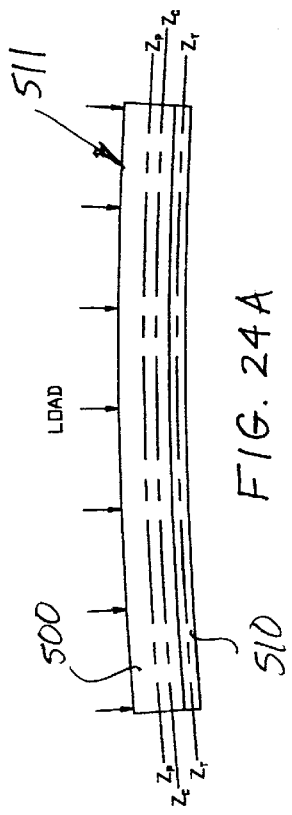
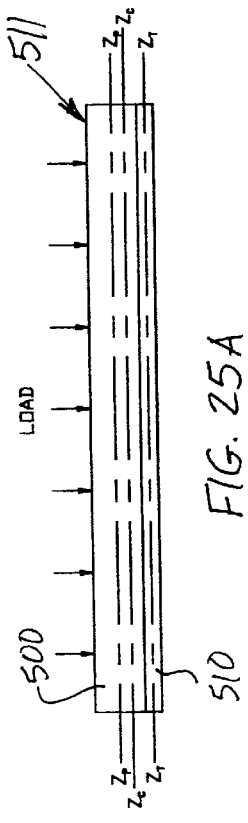
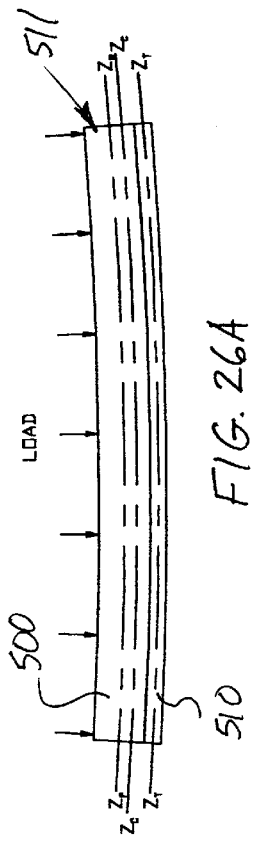
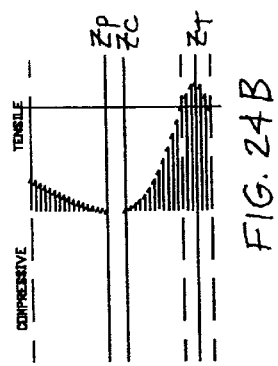
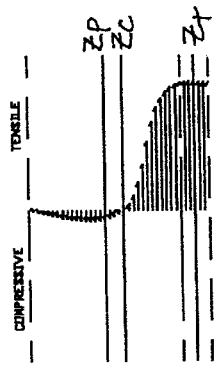
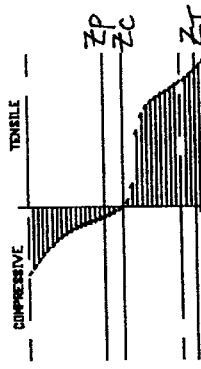

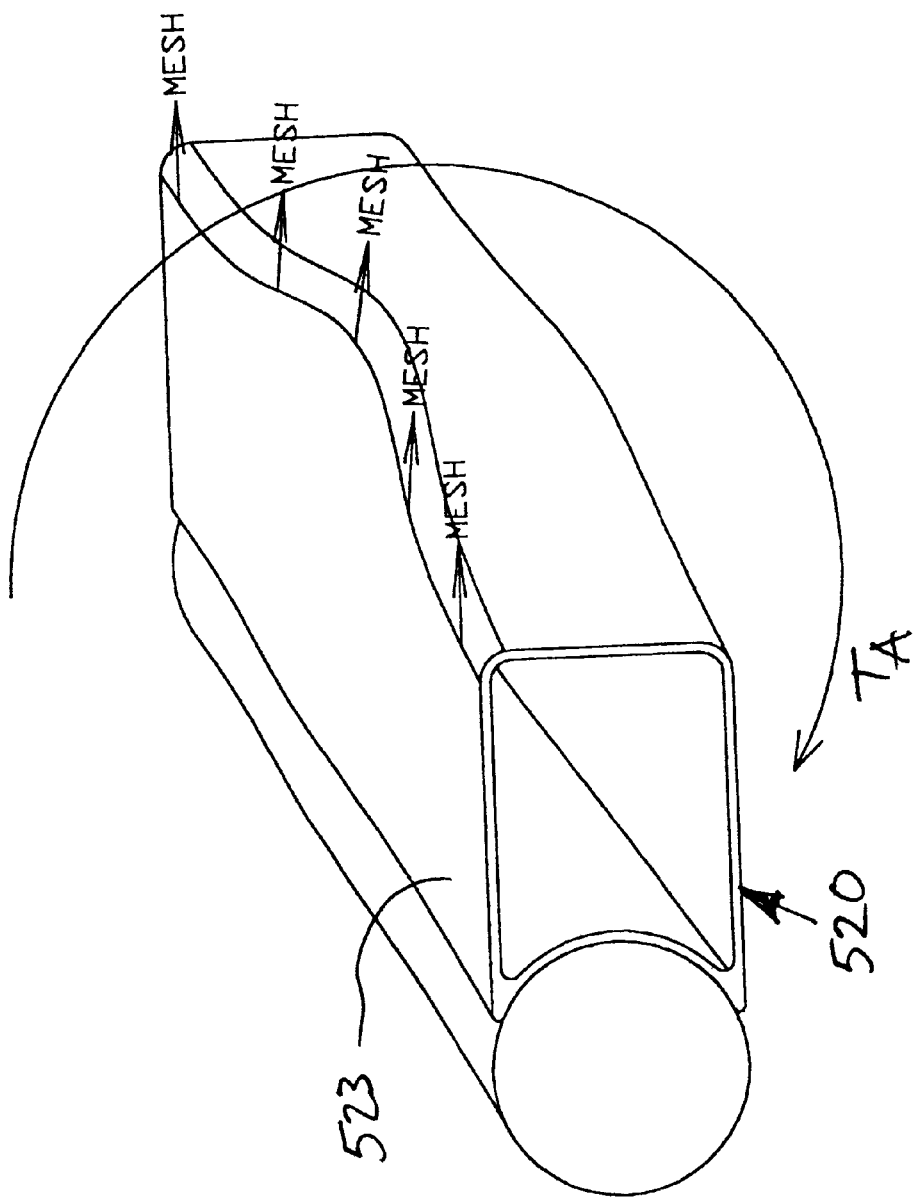

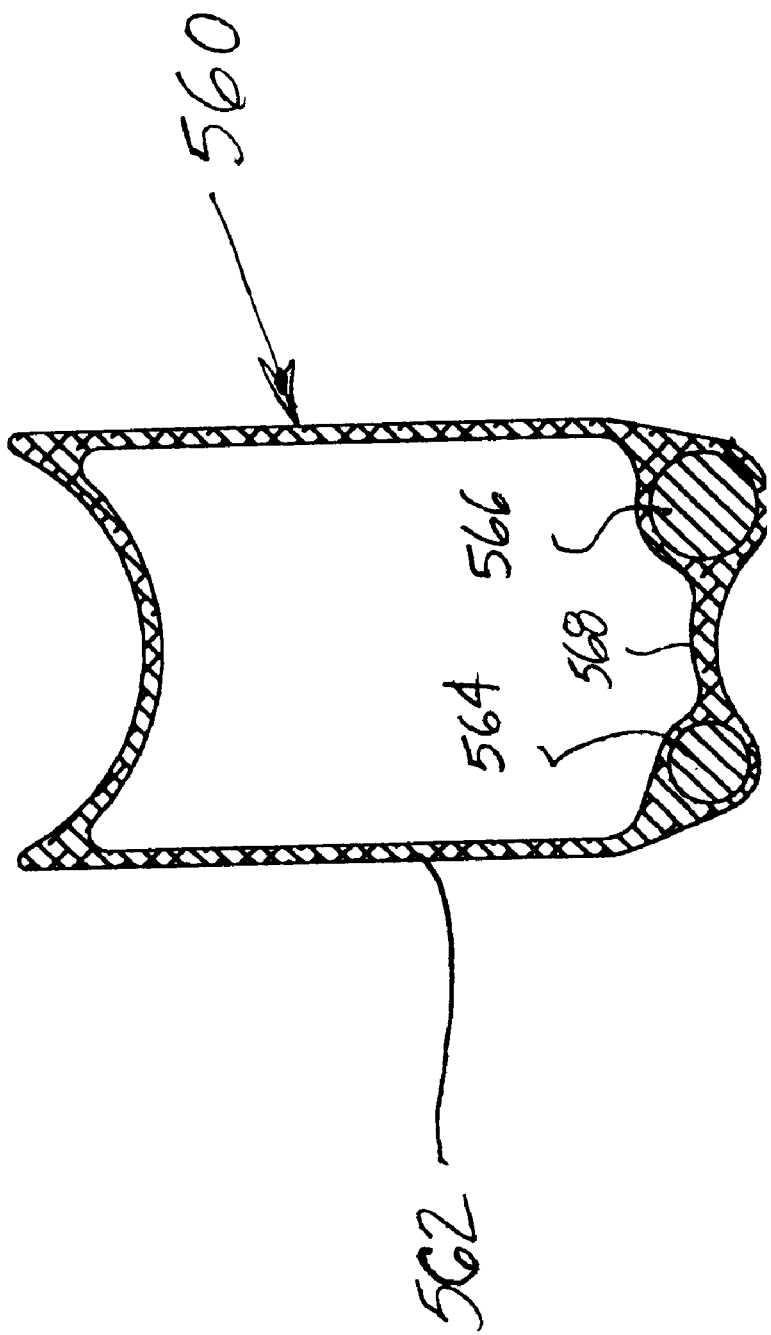

SCREEN PRINTING FRAME HAVING PRESTRESSING REINFORCEMENT

CROSS REFERENCE TO RELATED APPLICATION

This application claims the benefit of U.S. Provisional Application No. 60/158,220 filed Oct. 7, 1999.

FIELD OF THE INVENTION

The present invention relates to a frame for supporting the screen of a screen printing machine and in particular relates to reinforcement for such a frame to prestress and/or camber the frame.

BACKGROUND OF THE INVENTION

Screen printing machines utilize a tensioned screen of fabric or mesh mounted on a supporting frame. A squeegee forces ink or other fluid media through the screen over an area whose shape is defined by a stencil. The squeegee is moved under pressure across the screen to deflect the screen downwardly toward the substrate to provide for transfer of the fluid medium onto the substrate.

The screen of a screen printing machine is typically secured to a rectangular frame having coupled members which retain the edges of the tensioned screen. Prior art frames include frames known as "stretch and glue" frames in which a screen is adhered to a supporting frame while in a tensioned condition. Also known in the art are frames known as "roller frames" in which rollers are coupled together and rotatably supported by connecting members. Each of the rollers retains an edge of the screen for tensioning of the screen through rotation of the rollers. A locking mechanism secures the rollers to the connecting members to maintain the desired tension in a print screen. A typical roller of a roller frame includes a hollow cylindrical tube made of aluminum and having a longitudinally extending channel in which an edge of the screen is retained.

For larger frames, the coupled members of the frame can become long enough that the members become subject to undesirable transverse and torsional deflections. Such deflections may include inwardly directed deflections resulting from loads applied to the frame by the tensioned screen as well as sagging resulting from gravity forces acting on the frame. Undesirable vibration of the frame and the supported tensioned screen may result from forces applied to the screen by the squeegee. Vibration may also result from vertical reciprocation of the printing frame in certain printing machines. Such vibrations may require significant delay between print cycles to provide time for the vibrations to subside.

Tension forces applied to the frame by the screen may also cause downward and inward bending of the frame members resulting in an out of plane warping of the frame. As a result of the warping, the print area of the screen in reduced. Furthermore, such warping may also lead to undesirable inconsistencies during printing.

Reinforced structures for resisting deflections of frame members of screen printing machines are known in the art. U.S. Pat. Nos. 5,255,600 and 5,097,761 to Hamu show large and rugged truss-like structures for resisting transverse deflections of a roller frame. The disclosed structures are passive structures whose elements, apart from gravity effects, are not stressed in the absence of external loading. The truss-like structures of Hamu, when located inwardly of the rollers as shown in FIG. 1 of the '600 patent, encroach upon the printing area. The structures of Hamu provide rugged support at the expense of added weight as well as adding to shipping, handling and fabrication costs.

U.S. Pat. No. 4,345,390 to Newman, which is incorporated herein by reference, shows a roller frame having screen retaining rollers coupled together by corner members and inwardly disposed roller support members adjacent the rollers. The disclosed support members resemble I-beam and box beam sections having a curved flange portion referred to a "limit stop" and an opposite member which are connected by one or two webs, respectively. The curved flange portion provides a support surface which confronts the roller to resist inward deflections of the screen supporting roller. The disclosed support members, however, are passive structures whose elements, as described above, are not stressed in the absence of external forces. Therefore, in order to provide for increases in bending resistance utilizing the passive structures of the '390 patent, a deeper section is required for a given material. Use of thinner walls and deeper sections allows for increasing stiffness while limiting increased weight. However, the use of thinner walls results in increased stresses imposed on the support member for a given loading. Additionally, increasing the depth of the section results in encroachment of the support member towards or into the print area of the screen.

U.S. Pat. No. 3,908,293 to Newman, which is also incorporated herein by reference, discloses a roller frame in which the rollers supporting the screen are coupled together by corner members. The roller frame includes tensioning members extending between the corner members to camber the rollers. The tensioning members are located at a distance from the rollers toward the print area of the frame and therefore can only provide for one direction of cambering. Also, the roller is unsupported between the ends and therefore, with the exception of torsional restraint applied at the ends, remains unrestrained against transverse and torsional deflections.

What is needed is a frame for supporting the screen of a screen printing machine having coupled frame members in which the stiffness of the frame members against transverse and torsional deflections are increased effectively without undesirable increases in weight or encroachment on the print area of a supported screen. The present invention provides such benefits through the incorporation of reinforcement in intimate proximity to the frame member for prestressing and/or cambering of the frame member.

SUMMARY IF THE INVENTION

According to the present invention, there is provided a frame for supporting the screen of a screen printing machine. The frame includes elongated frame members coupled together each providing support for an edge of the screen.

The frame further includes a reinforcing member supported by the frame to extend in intimate proximity along at least a portion of at least one of the frame members and provide a prestress and/or camber of the frame member.

According to one embodiment of the invention the reinforcing member includes a cable extending within the interior of a frame member and having a tensioner attached adjacent to one end of the cable for tensioning the cable between bearing surfaces of the frame. The bearing surfaces may be defined by corner members coupling the frame members or alternatively by the frame member itself.

According to another embodiment of the invention the reinforcing member includes an elongated secondary member affixed to the frame member. The secondary member applies prestress to the frame member resulting from affixation of the secondary member while the members while an applied condition imposed differential strains on confronting surfaces of the frame member and the secondary member. The differential strains create a prestress and/or camber following affixation and removal of the imposed conditions. Differential strains may be imposed through applied loading to create transverse deflection of the frame member and the secondary member. Differential strains may also be imposed by loading to create axial compression of the frame member.

BRIEF DESCRIPTION OF THE DRAWINGS

For the purpose of illustrating the invention, there is shown in the drawings forms which are presently preferred; it being understood, however, that this invention is not limited to the precise arrangements and instrumentalities shown.

FIG. 19 is a partial plan view of a frame according to an embodiment of the present invention;

FIG. 20 is a sectional view taken along lines 20—20 of FIG. 19;

FIGS. 22A–26A are schematics illustrating the composite of FIG. 19 in various stages of affixation and deflection;

FIGS. 22B—26B are shear diagrams associated with FIGS. 22A–26A, respectively;

FIG. 27 is a schematic illustration showing a torque applied to a frame member by a tensioned screen;

FIG. 32 is a sectional view of a frame member according to an embodiment of the present invention.

DETAILED DESCRIPTION OF THE DRAWINGS

Figure 1:
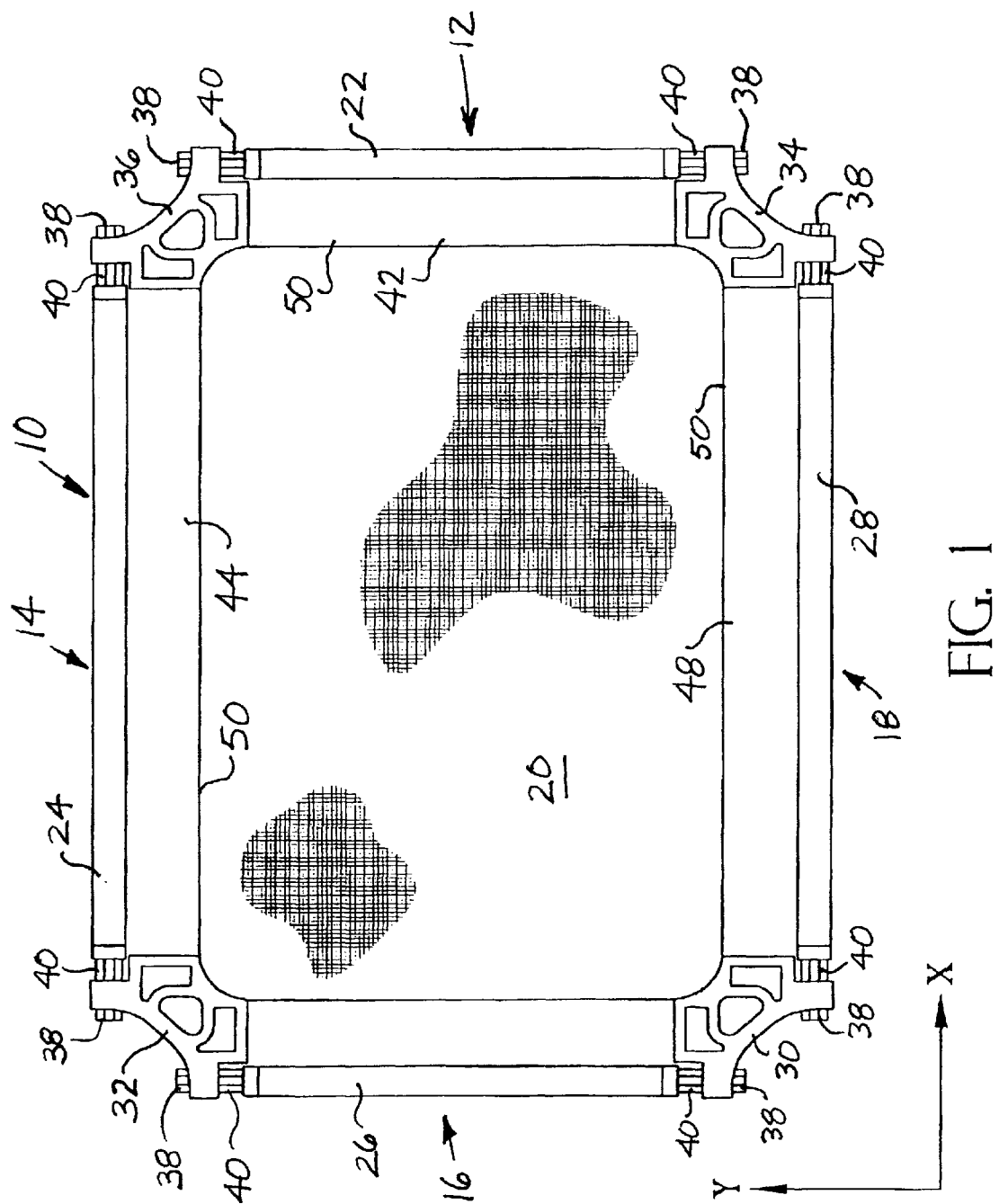
FIG. 1 shows a plan view of a screen printing machine having a frame according to the present invention supporting a tensioned screen.

In the drawings where like numerals identify like elements, there is shown in FIG. 1 a frame, designated generally by numeral 10, for supporting the screen 20 of a screen printing machine. The frame 10 includes four sides 12, 14, 16 and 18 that are coupled together at four corners 30, 32, 34 and 36. The screen 20, which may be a fabric or mesh for example, is attached to each side 12, 14, 16 and 18.

The frame 10 of the embodiment of FIG. 1 is a roller frame that includes a plurality of individual rollers 22, 24, 26 and 28 defining the sides of the frame 10. The rollers 22, 24, 26 and 28 are preferably hollow, generally cylindrical, tubes made of non-corrosive lightweight material such as aluminum. Each roller is attached at each end to a respective corner member by means of a bolt 38. The corner members are rigid members made of lightweight, non-corrosive material, such as aluminum or steel. Each end of the rollers includes a nut-like element 40 which serves as an end plug. The nut like element 40 is shaped to receive a correspondingly shaped wrench member or torsion tool to rotate the rollers to tension the screen 20. The nut may take the form shown in U.S. Pat. No. 5,127,176, which is herein incorporated by reference. A locking groove (not shown) or other securing means is provided in each of the rollers to retain an edge portion of the screen 20. The screen 20 is secured to the locking groove by locking strips (not shown) in the manner shown in U.S. Pat. No. 4,525,909, which is herein incorporated by reference.

Figure 3:
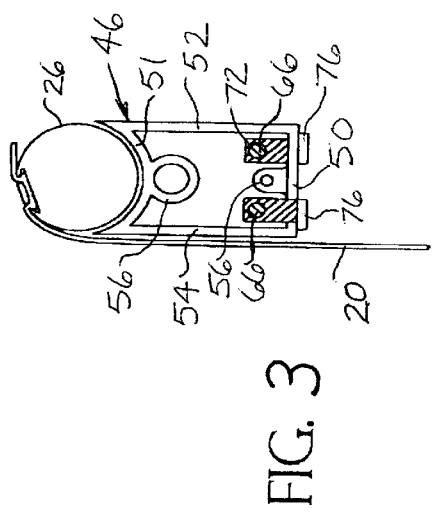
FIG. 3 is a schematic sectional view taken along the lines 3—3 of FIG. 2.
Figure 5:
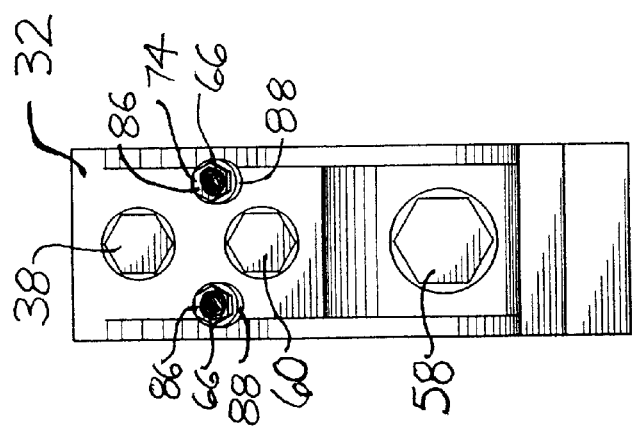
FIG. 5 is an end view taken along the lines 5—5 of FIG. 4.
Figure 4:
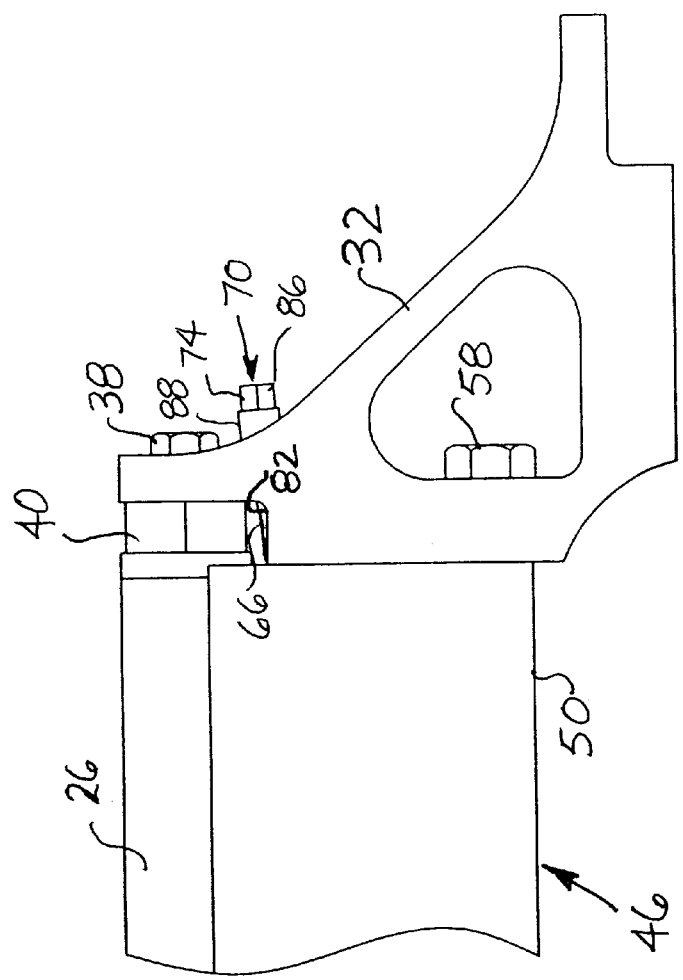
FIG. 4 is a partial plan view of the frame of FIG. 1.
Figure 7:
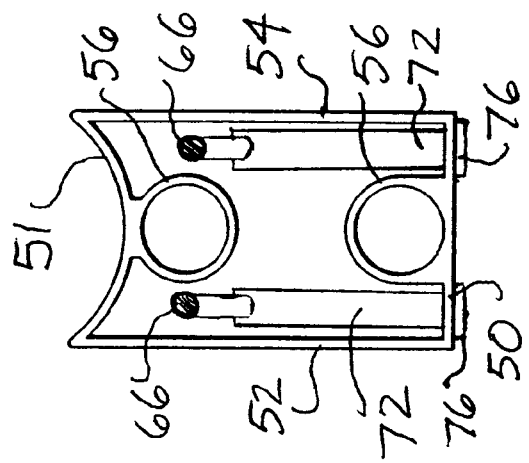
FIG. 7 is an end view taken along the lines 7—7 of FIG. 6.

The frame 10 includes a plurality of support members 42, 44, 46 and 48 which are provided to reinforce each roller and resist bowing of the roller resulting from tensioning of the screen 20. The support members 42, 44, 46 and 48 are preferably located inwardly of their associated roller and extend between adjacent corner members 30, 32, 34 and 36, respectively. In the preferred structures, the support members 42, 44, 46 and 48 are substantially rectangular shaped extruded hollow box beams made of non-corrosive material such as aluminum, steel, fiberglass reinforced plastic, or the like. Each of the support members 42, 44, 46 and 48 has two ends and extends longitudinally between the ends. Preferably, the support members are of the type shown in U.S. Pat. No. 4,345,390, which is incorporated herein by reference. The support members 42, 44, 46 and 48 need not be identical in a frame made according to the present invention. Furthermore, each of the frame members need not be reinforced by prestressing reinforcement. For the purposes of describing a frame member reinforced by prestressing reinforcement according to the present invention, however, it will be sufficient to describe only one of the support members of FIG. 1. Therefore, only support member 46 of support members 42, 44, 46 and 48 will be hereinafter described. As shown in FIG. 3, support member 46 includes a flange 51 defining a support surface which confronts roller 26. Preferably, the support surface of flange 51 is arcuate having a radius of curvature slightly larger than the roller 26. The flange 51 is joined to an opposite end wall 50 by a pair of spaced apart webs 52 and 54 thereby defining an interior of the box beam. As best seen in FIGS. 3 and 7, a pair of cylindrical tubes or bosses 56 is located within the interior adjacent the flange 51 and the end wall 50. The ends of the bosses 56 have an inner periphery that is threaded so as to receive a bolt, such as bolt 58 shown in FIG. 5.

A pair of cables 66 extending within the interior of support member 46 serve as prestressing reinforcement members for support member 46 as will be described in greater detail. The cables are preferably made from steel having high tensile strength and modulus of elasticity. Although shown in the form of a circular cable, any tension member having an elongated and flexible configuration such as a rod or bar could be utilized. The cables are laterally spaced with respect to support member 46 and have opposite threaded ends 68, 70 extending through openings in corner members 30, 32. Attached to each end 68, 70 of the cables is an adjustable tensioner 74 which includes a nut 86 and a spacer 88. Each of the spacers 88 is slidably received on one of the ends 68, 70 for contact between the spacer 88 with a surface of one of the corners 30, 32 which serves as a bearing surface. Internal threads of nut 86 engage threads on cable 66 to tension cable 66 between the bearing surfaces of corner members 30, 32 as the tensioners 74 are advanced on cable 66. Compressive forces are applied to the corner members in reaction to the cable tension through contact between the spacers 88 and the bearing surfaces of corner members 30, 32. The compressive forces are transferred to the support member 46 through the corner members 30, 32 to compress the support member 46. The adjustable tension applied to the cables results in compressive prestress forces applied through the corner members to the ends of support member 46. The compressive prestress forces increase the bending stiffness of the support member 46. Prestressing of the support member also provides an additional benefit related to the dynamic response of the support member. During printing, the squeegee of a screen printing machine deflects the screen from an "off contact" position into contact with the substrate to force ink through the mesh and to create a printed image. When the screen snaps upwardly after the passage of the squeegee, the frame vibrates. Vibrations of the print frame during printing may result in variations in the thickness of the material applied to the substrate. In certain applications, such as in the production of electric or electronic circuitry which often utilize screen printing processes to apply material to circuit boards, variations in the thickness of the applied material would have a direct and detrimental effect on the functional quality of the resulting product. Therefore, significant delay are sometimes required to provide time for vibrations to subside, particularly for larger frames. The prestressing effects of the present invention serves to shorten the amount of time required for vibrations of the support member to be dampened. The dampening benefit represents significant potential time savings, particularly for very large frames, where vibration of the print frame associated with vertical displacement of the frame between print cycles may result in significant production delays.

Figure 2:
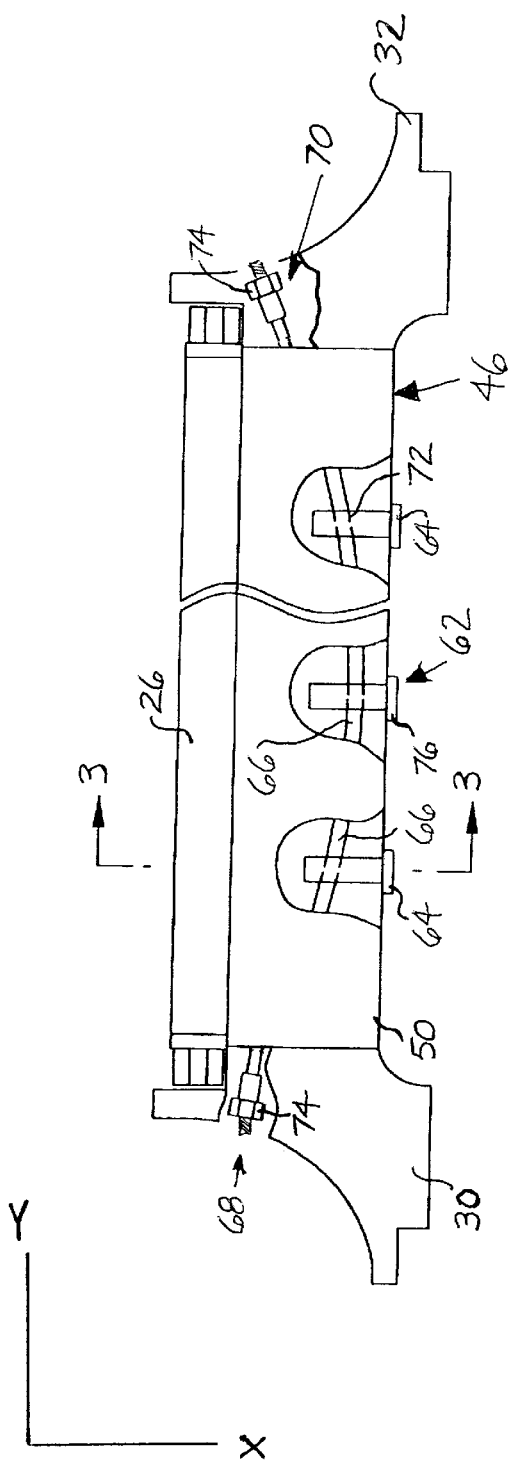
FIG. 2 is a schematic plan view of one side of the frame of FIG. 1 illustrating reinforcing members for one of the frame members.

A cable support structure 62 couples the cables 66 to the support member 46 intermediately of the ends of support member 46 and therefore between the support of the cable 66 provided by the frame at the bearing surfaces of corner members 30, 32. The cable support structure includes spaced cable support pins 64 extending from end wall 50 on opposite sides the boss 56 as shown in FIG. 3. Each of the pins 64 has an eyelet 72 through which one of the cables 66 slidably extends and an enlarged head portion 76 to retain the cable at a predetermined transverse location. As seen in FIG. 2, it is preferred that the pins 64 be constructed so that the distance from the head portion 76 of the pin to the eyelet opening 72 is not a constant for all of the pins. In this manner the cables may be coupled to the support beam 46 in a non-linear configuration. A similar support structure 62 may be associated with each of the support members 42, 44 and 48. In the preferred embodiment, the number of pins is chosen such that the non-linear configuration begins to approach the arcuate parabolic configuration shown in which the cables 66 are closest to the end wall 50 at the center of support member 46 and approach the flange 51 adjacent to the ends of the support member 46. Although the arcuate configuration is preferred, other non-linear configurations could be used such as a V-shape achieved through a single pin 64 centrally located between the ends of the support member 46. The non-linear configuration of the coupled cable provides for an outwardly directed prestress cambering of the support member 46 with respect to frame 10 upon tensioning of the cables 66. The cambering of support member 46 outwardly with respect to the frame will counteract inwardly directed deflections of the roller under loading applied by a tensioned screen 20. Although the use of a pair of laterally spaced cables 66 is preferred, a single cable could be utilized to provide for prestress of the support member and for outward camber in accordance with the present invention. However, the use of a laterally spaced pair of cables provides for a benefit related to the adjustable nature of the tensioned cables. By adjusting the tensioning to impose a differential tension between the pair of cables, a cambering of the support member in an off-axis direction which is perpendicular to the plane of the tensioned screen, may be achieved. Such off-axis cambering could have potential benefit for example in very large frames to counteract sagging effects of gravity.

Frame 10 is assembled in the following manner. To assemble the cable support structure 62 within support member 46, the pins 64 are positioned along the outer surface of end wall 50 before the support member 46 is secured to its associated corner members 30 and 32. The pins 64 are partially inserted into end wall 50 of the support member 46, using a hammer or other means for example, such that the eyelets 72 are aligned along the length of support member 46. In this manner, the cables 66 may be advanced in a straight line through the eyelets 72. Thereafter, the support members 64 are fully inserted into the interior of the support member 46 until the respective head portions 76 engage the outer surface of end wall 50 to configure the cables 66 substantially in the form of a parabola as shown.

Figure 6:
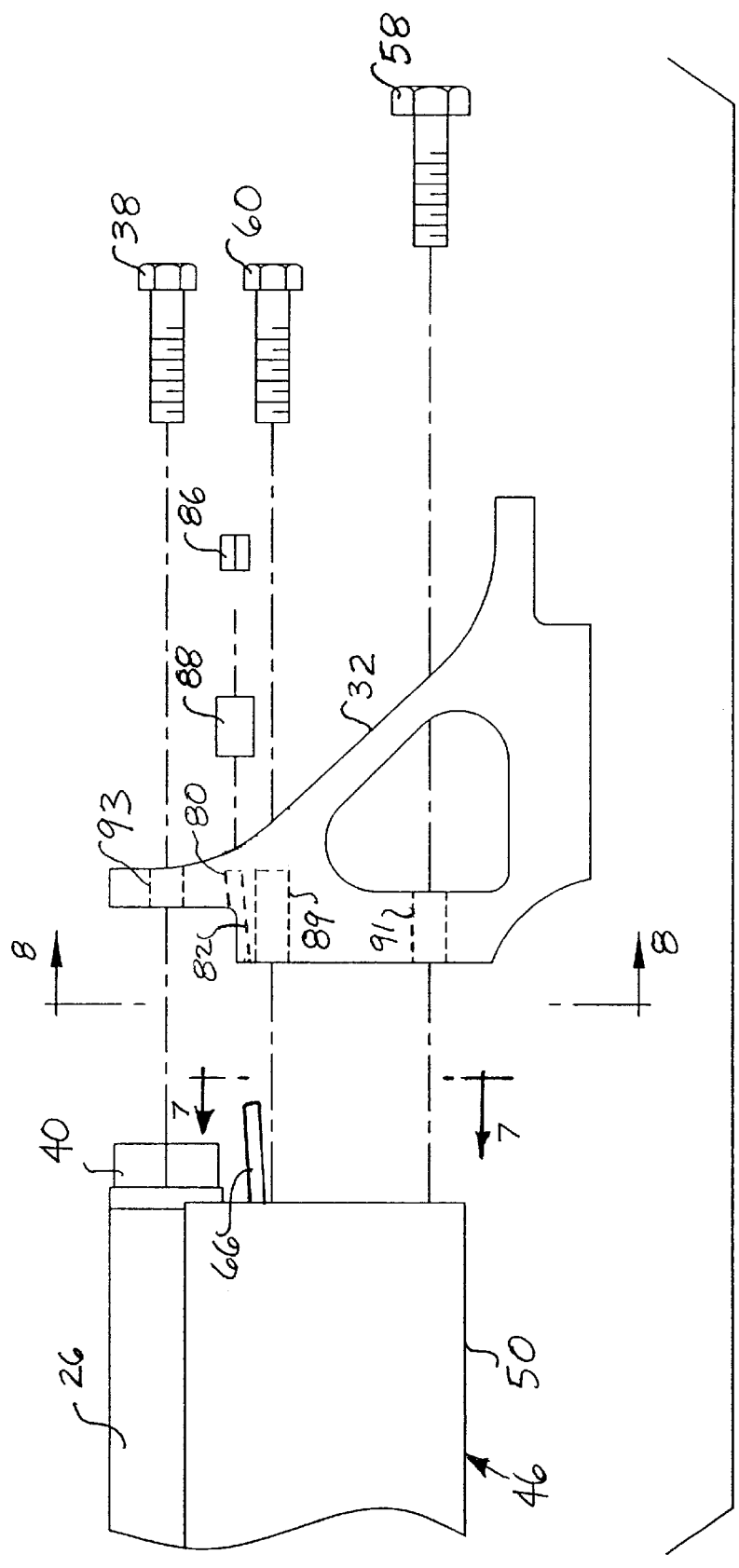
FIG. 6 is a partial exploded plan view of one side of the frame of FIG. 1.
Figure 8:
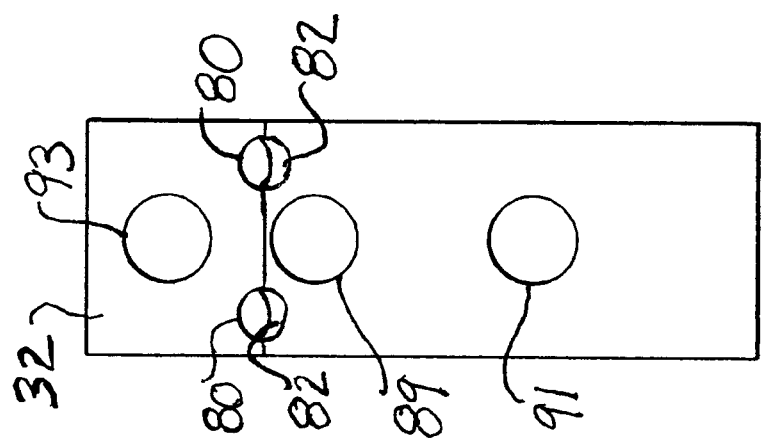
FIG. 8 is an end view taken along the lines 8—8 of FIG. 7.

The corner members 30, 32 are then attached to the support member 46 by advancing the ends 68, 70 and 70 of the cables 66 through openings 80 in the corner members, see FIGS. 6 and 8. As shown in FIGS. 6 and 8, the corner 30 members 30, 32 are provided with channels 82 to guide the ends 68, 70 of cables 66 through the corner members to the openings 80. Next, the tensioners 74 are attached to the ends 68, 70 of the cables 66, as previously described, to begin to pull the corner members 30, 32 inwardly toward the support member 46. Upon seating of the corner members on the support member 64, further engagement of the tensioners on the ends of cables 66 will create tension in the cables 66 and corresponding compression in the support member 46. Thereafter, bolts 58, 60 are inserted through holes 89, 91 in corner members 30, 32 into bosses 56 and are partially tightened therein. Roller 26 is then positioned between corner member 30, 32 and bolts 38 are inserted through corner members 30, 32 into opposite ends of the roller through openings 93 in the corner members 30, 32. The bolts 38, 58 and 60 are then tightened to secure the roller and support member to the corner members 30, 32 for subsequent prestress and/or camber of the support member 46 in the manner previously described.

Figure 9:
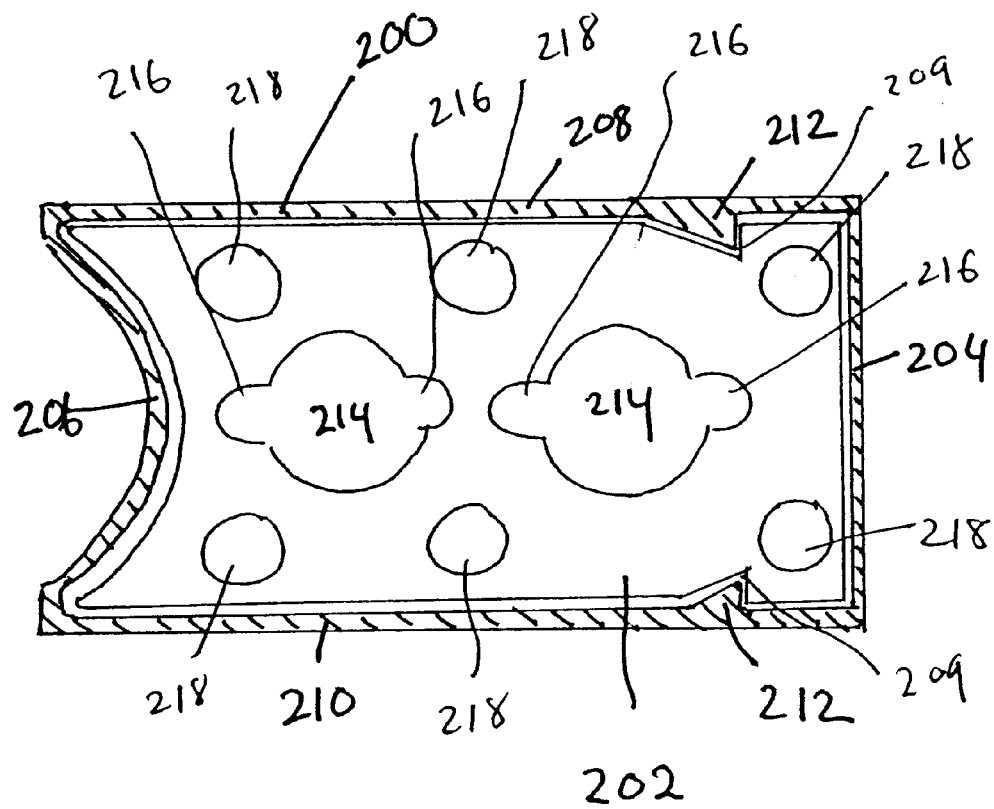
FIG. 9 is a cross sectional view of a frame member according to an embodiment of the present invention.

FIG. 9 shows an alternative embodiment of a box beam support member 200 having correspondingly shaped cable support plates 202 positioned within its interior. The cable support plates 202 are positioned within the support member 200 at locations where coupling of the cables 66 to the support member 200 is desired. The support member 200, as seen in cross section in FIG. 9, includes a flange 206 defining a support surface which confronts a roller in the manner previously described for support member 46. The support member 46 further includes an opposite end wall 204 joined to flange 206 by a pair of spaced apart and generally parallel webs 208, 210 defining an interior for support member 200. Noticeably, support member 200 is different than support member 46 described above in that the bosses that receive the attachment bolts for the corner members have been eliminated. The cable support plates 202 are sized to extend substantially between flange 206 and end wall 204. Each web 208, 210 includes a projecting step 212 that extends from the web into the interior of support member 200 projects inwardly toward each other. The cable support plate include peripheral notches 209 which interfit with the projecting steps 212 of the webs 208, 210 of support member 200. The interfitting steps 212 and notches 209 serve to maintain the cable support plate 202 in a generally perpendicular orientation with respect to the support member 200 and prevent pivoting of the cable support plate within the support member 200. Alternatively, instead of providing the steps 212 and notches 209, the cable support plates 202 could be made sufficiently thick to maintain the orientation of the cable support plate within the support member 200.

Each of the cable support plates 202 includes a pair of key holes 214 having opposed recesses 216. Each cable support plate 202 further includes two sets of eyelets 218 located on opposite sides of the keyholes 214 for slidably receiving cables 66. Each of the sets includes three spaced apart eyelets 218 thereby providing for variation in the transverse positioning of the cable 66 in an arcuate configuration by advancing the cable through different eyelets from location to location. Alternatively, differing cable support plates could be made in which single eyelets are located in different positions on the support plate. However, the multiple eyelet cable support plate facilitates desirable efficiencies in manufacture and installation.

Figure 10:
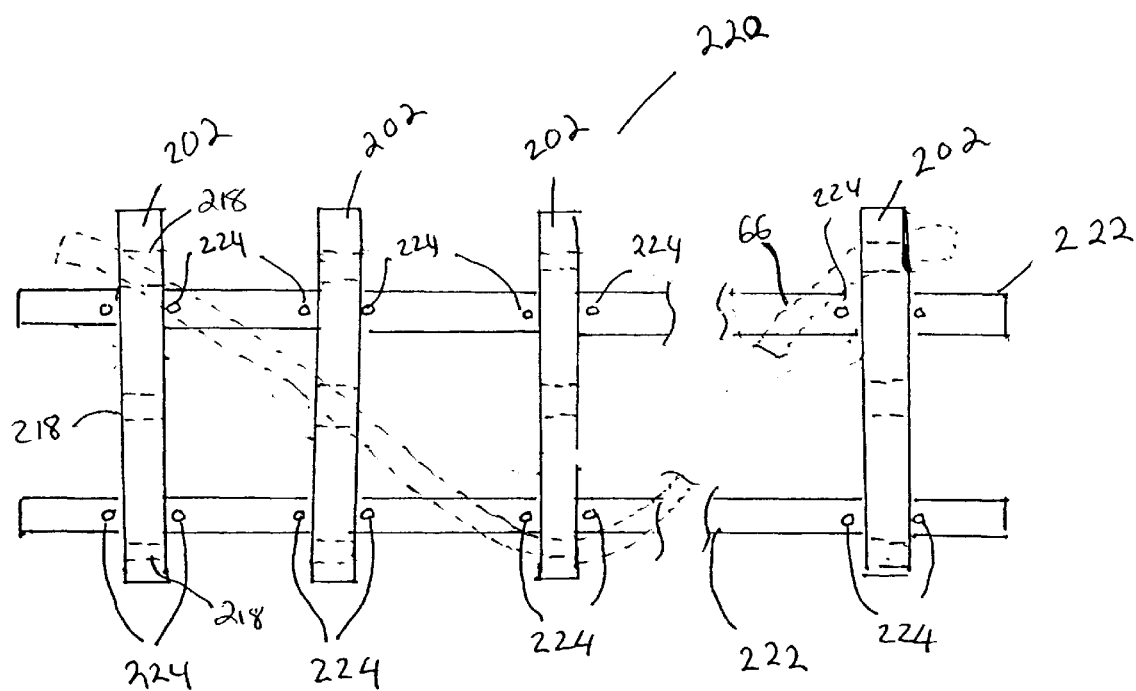
FIG. 10 is a schematic illustration showing a delivery system associated with the frame member of FIG. 9.

As illustrated in FIG. 10, a removable delivery assembly 220 is provided to position the support members 202 in the interior of the support member 200. A pair of keys 222, in the form of rods or bars are inserted into the key holes 214 in the support members 202. A plurality of projecting knobs 224 are located on opposite sides of the key 222. The knobs 224 are arranged in pairs such that the spacing between the knobs of a pair is slightly greater than the thickness of the cable support plate 202 to retain support members 202 on the keys 222 at the desired positions along the length of the keys. The keys 222 are advanced through the keyholes 214 of the support members 202 such that the knobs 224 pass through the recesses 216. When the keys 222 are positioned such that each support plate 202 is located between a pair of knobs 224 for each of the keys, the keys 222 are rotated so that the knobs 224 are angularly misaligned from the recesses 216 thereby preventing the removal of the keys 222 from the cable support plates. Next, the cables 66 are advanced through the desired eyelets 218 to form a nonlinear configuration. Alternatively, the support members 202 may be separately advanced onto the keys 222 as cables 66 are fed through the eyelets 218. The delivery assembly 220 is inserted into the support member 200 and the keys 222 are rotated to angularly align the knobs 224 with the recesses 216. The keys 222 are then removed from the support member 200 from either end.

Following insertion of the cables 66 and the cable support plates 202, the opposite ends of the cables 66 are advanced through openings in corner members and tensioners 74 are attached to the cables 66, in the manner described above. Tension applied to the cables 66 after contact between the corners and the ends of the support member 200 will urge the cable support plates 202 into contact with the flange 206 of support member 200 to brace the cable support plates 202 and lock them in place.

Figure 11:
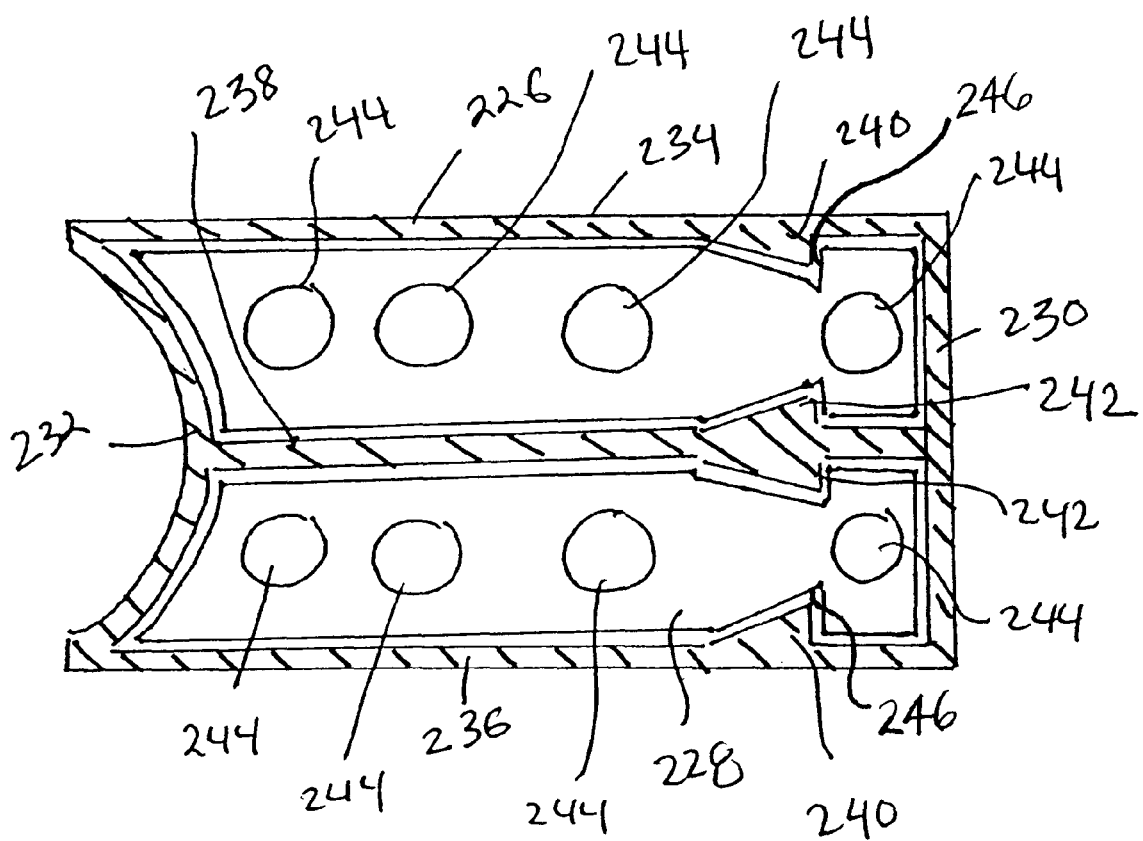
FIG. 11 is a cross sectional view of a frame member according to an embodiment of the present invention.
Figure 13:
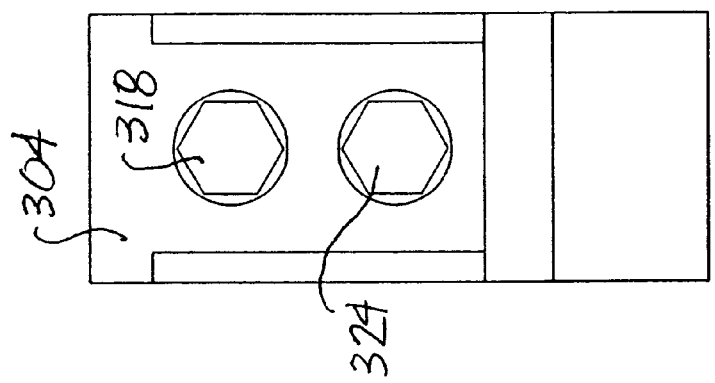
FIG. 13 is an end view taken along the lines 13—13 of FIG. 12.
Figure 12:
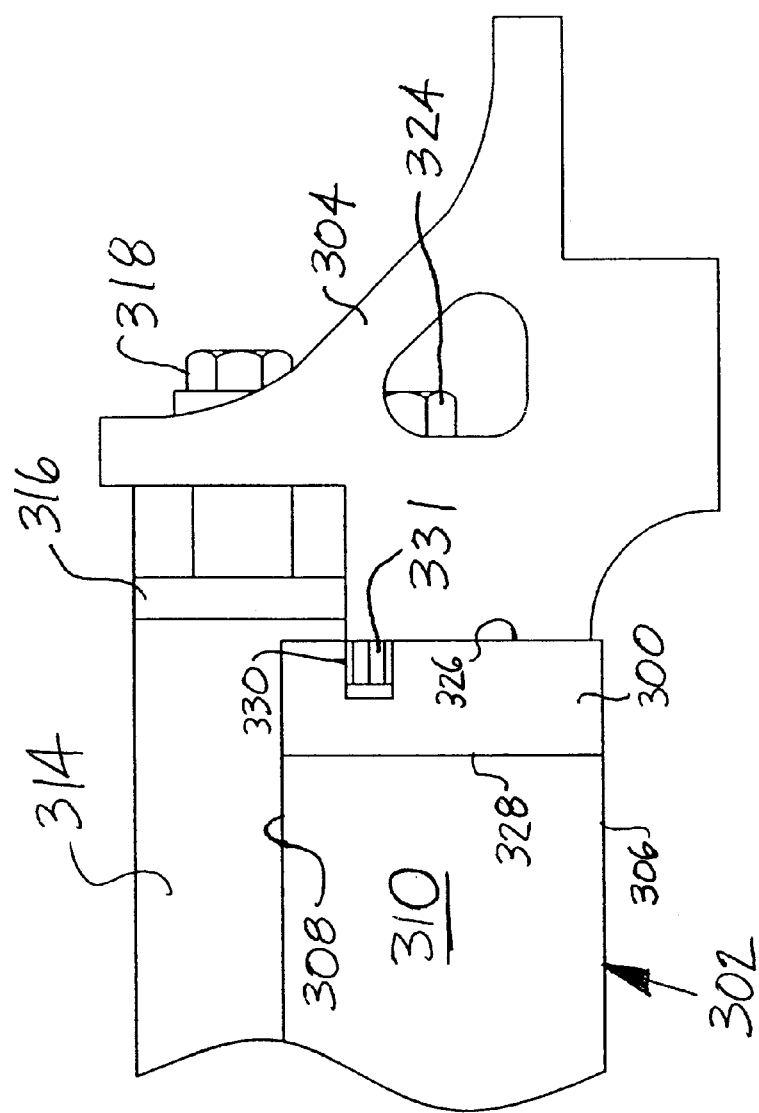
FIG. 12 is a partial plan view of a frame according to an embodiment of the present invention.

FIG. 11 shows an alternative embodiment of a support member 226 and cable support plates 228. The support member 226 includes an end wall 230 that is joined opposite a flange 232 by a pair of spaced apart and generally parallel webs 234,236 to define an interior. An internal web 238 extends between end wall 230 and flange 232 to bisect the interior into halves. Each of the webs 234, 236 has an inwardly projecting step 240 and internal web 238 has steps 242 on opposing sides which are located opposite of the interior halves from the steps 240. Each of cable support members 228 includes a plurality of spaced eyelets 244 and peripheral notches 246 and is shaped and dimensioned to fit within one of the interior halves.

FIGS. 12–16 show a further embodiment of a frame according to the present invention having end caps 300, of which only one is shown, located intermediately of a support member 302 and corner members 304. The end caps 300 are preferably made of a lightweight non-corrosive material such as aluminum. The support member 302 includes an end wall 306 joined opposite an arcuate flange 308 by a pair of generally parallel webs 310 defining an interior of support member 302 in a similar manner as the support member 46. A roller 314 is supported on the arcuate flange 308 and includes end plugs 316 having a nut-like portion that is used for rotating the roller 314 about its longitudinal axis. The roller 314 is positioned within the arcuate surface of flange 308 and connected at each of its ends to corner members 304 by bolts 318 extending through an openings 319 in corner members 304.

Figure 16:
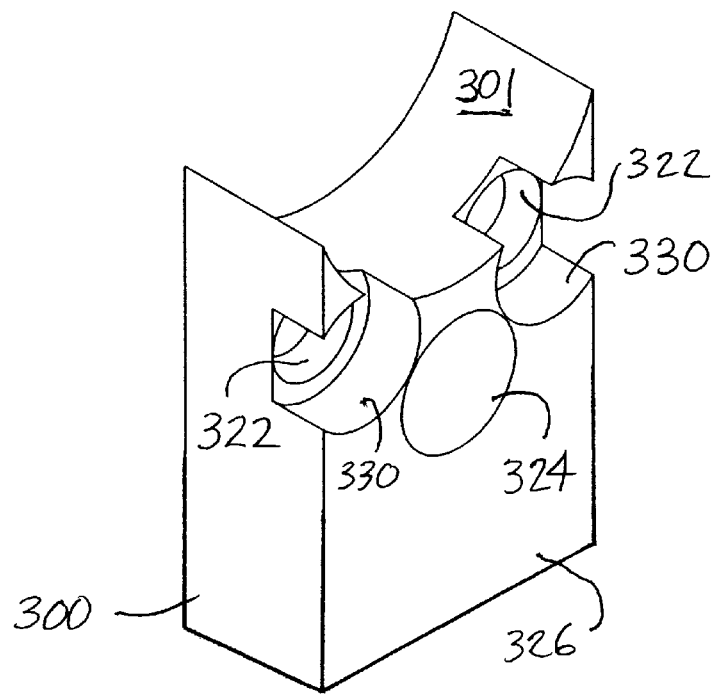
FIG. 16 is a perspective view illustrating a side of the end cap opposite the side illustrated in FIG. 15.
Figure 15:
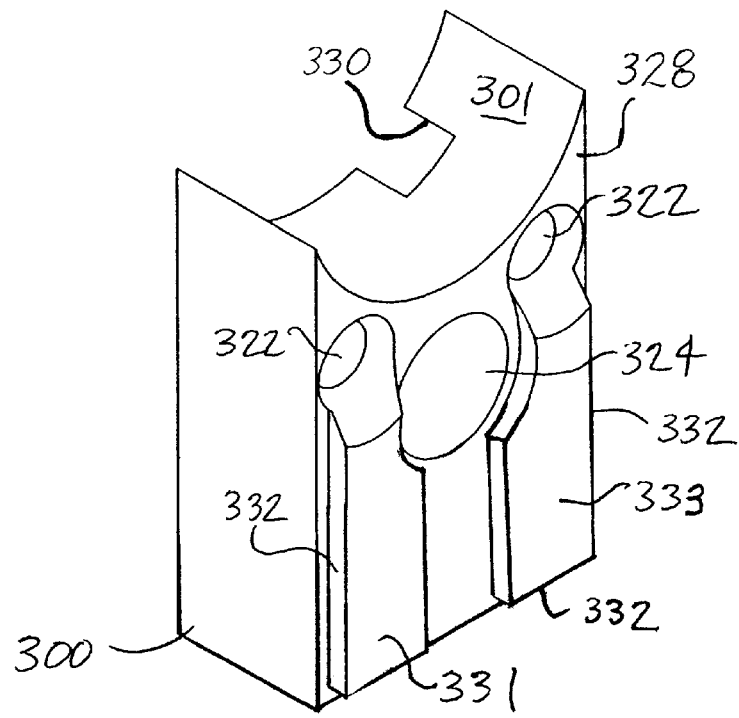
FIG. 15 is a perspective view illustrating a side of the end cap of FIG. 14.

Each of the end caps 300, best seen in the perspective views of FIGS. 15 and 16, has an arcuate top surface 301 that matches the flange surface 308 of support member 302. A pair of openings 322 are provided adjacent to the flange surface 308 for the ends of cables 66. As best seen in FIG. 16, the openings are counterbored and communicate with a recess 330 in a first surface 326 in which a threaded tensioner 331 is received. The counterbored portions in first surface 326 define the bearing surfaces for the frame between which the cables 66 will be tensioned in a similar manner as described previously with respect to support member 46. An opening 324 is provided for an attachment bolt 320 which extends through the end cap 300 from an opening 321 in corner member 304 to engage a threaded boss (not shown) in the end of support member 302 to secure the corner member 304 and the end cap 300 to an end of support member 302.

Figure 14:
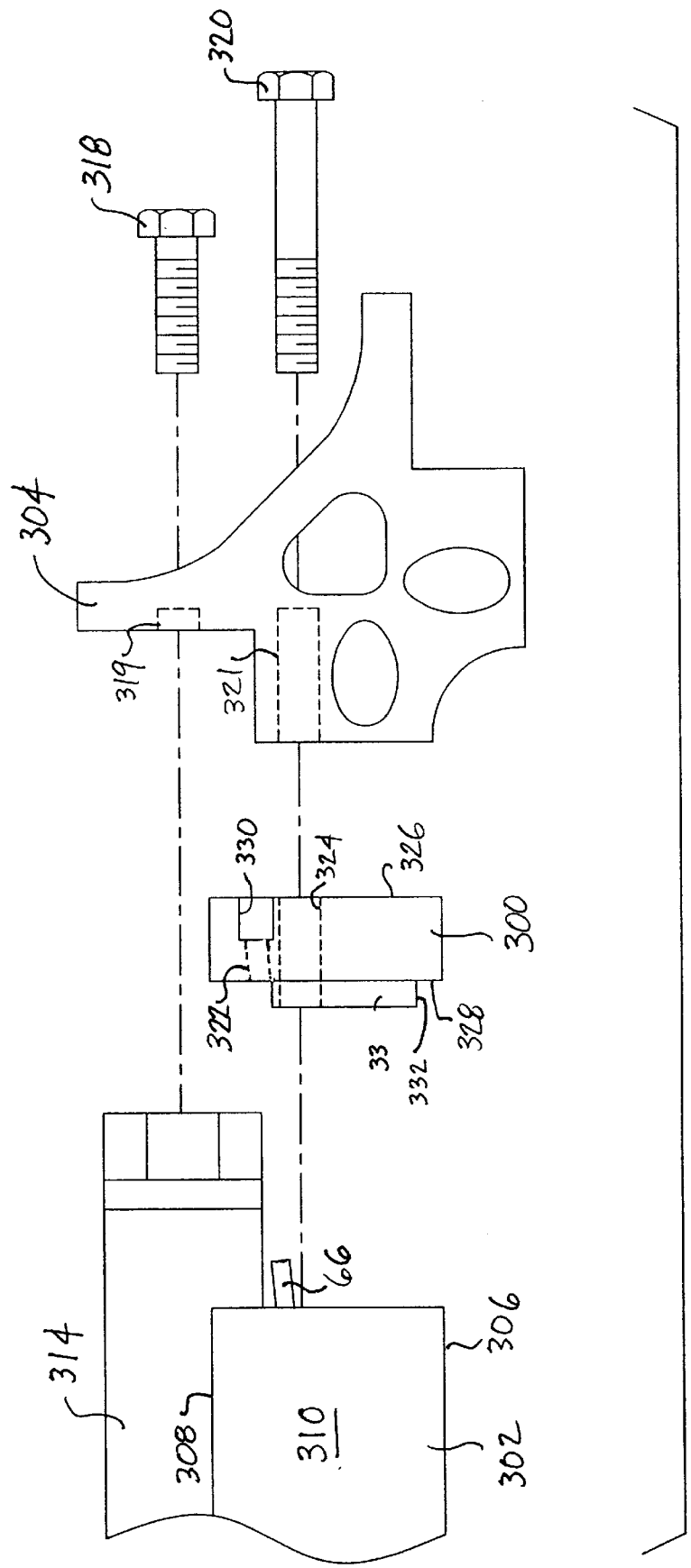
FIG. 14 is a partial exploded plan view of the frame of FIG. 12.

Referring to FIGS. 14 and 15, a second surface 328 of the end caps 300 includes projecting portions 333 which define a peripheral lip 332 which is sized to fit within the interior of support member 302 when the end cap is secured to the support member 302 such that the end cap will appear to be an extension of the support member 302. The lip 332 defines a contact surface between the end cap 300 and the support member 302 which helps to more evenly distribute loading applied to the ends of support member 302 so that the support member will not become deformed when it is connected to the corner member 304. The lip 332 also serves to seal the end of the support member 302 to prevent fluids from entering the interior of support member 302.

Figure 17:
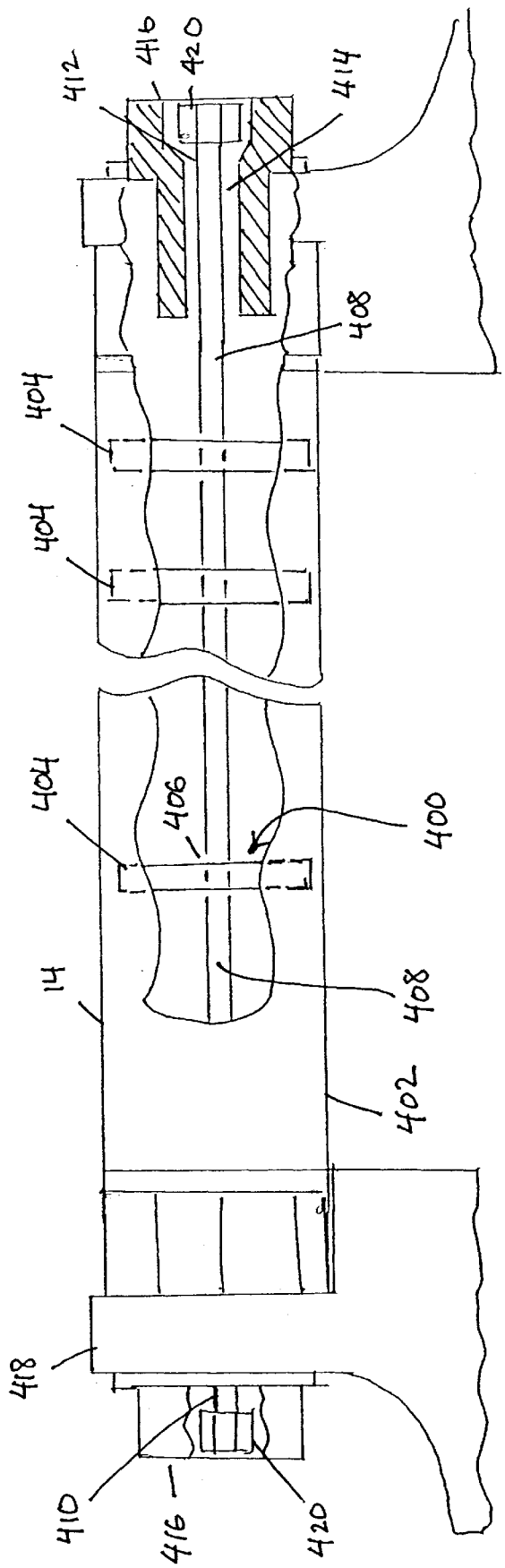
FIG. 17 is a partial plan view partially in section of a frame according to an embodiment of the present invention.
Figure 18:
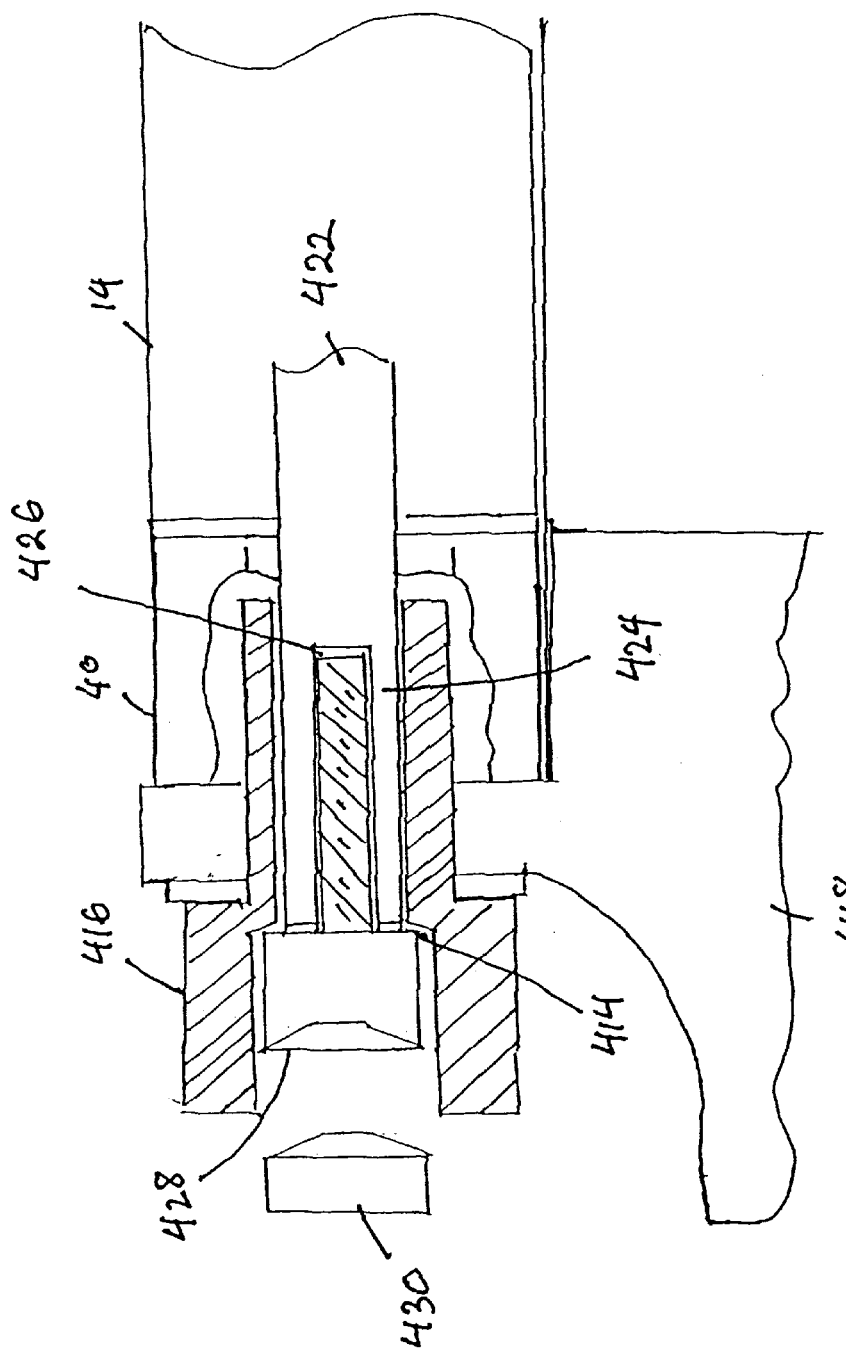
FIG. 18 is a partial plan view partially in section of a frame according to an embodiment of the present invention.

FIG. 17 shows a further embodiment according to the present invention in which a reinforcing support structure 400 prestresses a roller 402 of a roller frame. The reinforcing structure 400 is disposed within the interior of the roller 402 and includes a plurality of cylindrically shaped disks 404 slightly smaller in diameter than an interior of the roller 402. An eyelet 406 is provided in the center of each disk 404 to slidably receive a cable 408. Each of threaded ends 410, 412 of cable 408 extend through a channel 414 formed in a bolt 416 that attaches the roller 402 to the corner members 418. A tensioning nut 420 engages each of the threaded ends 410, 412 and bear against a counterbore 414 within bolt 416 to tension the cable 408 and compress the roller 402 thereby stiffening the roller. It is contemplated that the location of the eyelets could be varied to configure the cable in a non-linear configuration such as a V-shape to camber the roller as the cable 408 is tensioned. An alternative embodied tension member 422 is shown in FIG. 18 to prestress a roller 402. The ends of the tension member 422 include a threaded channel 426. A tension bolt 428 is inserted through a bore 414 within the roller attachment bolt 416. The tension bolt 428 is threaded into the channel 426 and rotated to create tension. As shown in FIG. 18, the head of the tension bolt 428 is countersunk and receives a plug 430 that seals the end of the roller bolt 416 and thus the interior of the roller.

Figure 18A:
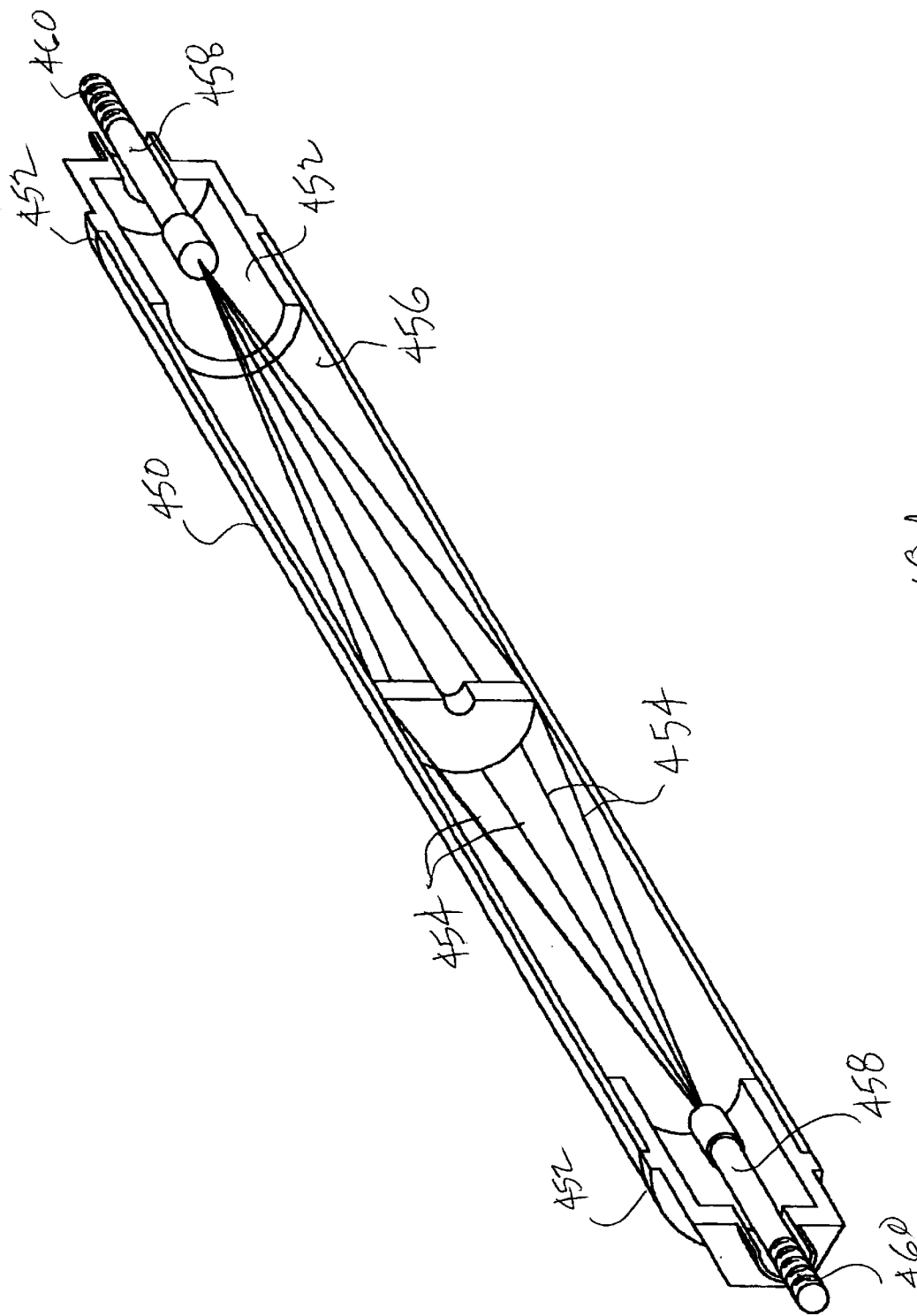
FIG. 18A is a perspective section view of a frame member according to an embodiment of the present invention.

Referring to FIG. 18A, there is shown a further embodiment of a reinforced roller 450 according to the present invention. The roller 450 includes opposite end plugs 452 and a plurality of cables 454 of high modulus material extending through an interior 456 of the roller 450. The cables are secured at opposite ends to connectors 458 each having a threaded end portion 460 for engagement with a threaded tensioning member to apply tension to the cables 454. A spreader disk 462 is positioned within the interior 456 to maintain the cables in the radially symmetric truss-like configuration shown. The spreader disk 462 is sized so that the outer periphery of the disk 462 is frictionally restrained against axial movement with respect to the roller 450. The radially symmetric cables 454 are tensioned to provide preload of the roller to increase the flexural stiffness of the roller 450 against transverse loading.

Figure 21:
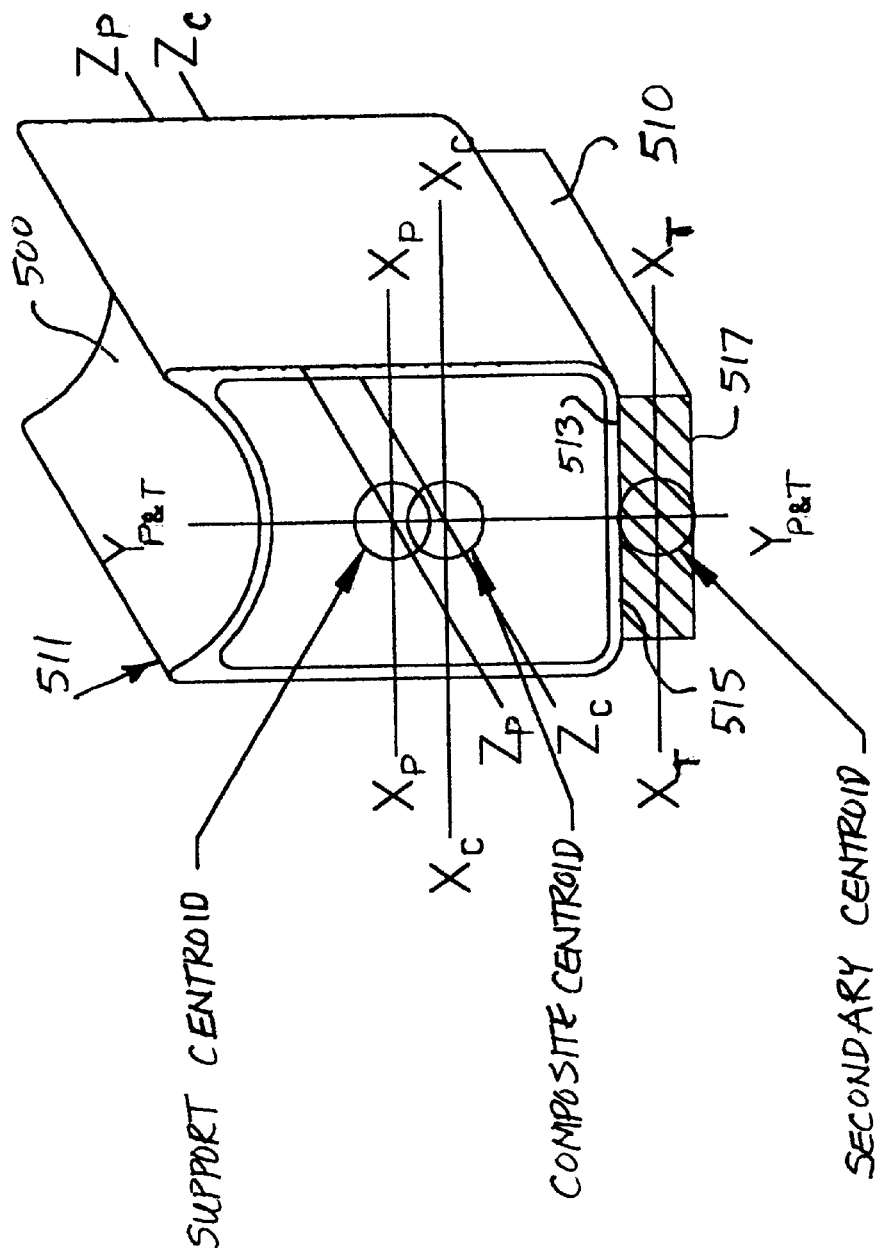
FIG. 21 is a perspective view of the composite of FIG. 19.

Referring to FIGS. 19–32, there is shown further embodiments of prestressed support members having a secondary member which has been affixed to the support member. As will be described in greater detail, the affixation occurs under imposed conditions which place differential strains on the confronting surfaces of the support member and secondary member. Referring to FIGS. 19–21 there is shown a prestressed support member 500 having a secondary member 510 affixed to an outer surface of the support member 500 as by welding or adhesion for example. Other conceivable methods of affixation include compressive crimping between the support member and the secondary member to secure the secondary member.

As best seen in FIG. 20, the support member 500 includes an arcuate flange 502 defining a support surface which confronts a roller 503 in the manner previously described. The support member 500 further includes an opposite end wall 504 joined to flange 502 by a pair of spaced apart and generally parallel webs 506 defining an interior for support member 500. The support member 500 is supported between corner members 505, 507. Referring to FIG. 21, the support member has centroidal axes, identified as $X_P$ and $Y_P$, and the secondary member has centroidal axes, identified as $X_T$ and $Y_T$. After affixation, the resulting composite will have an X-axis centroid, identified as $X_C$. The Y-axis centroid of the composite will be the same as that for the support member 500 and the secondary member 502 because of the symmetrical alignment.

The relatively large distances from the centroidal axis $X_P$ of the support member 500 to the end wall 504 and to the arcuate flange 502 results in a section having a relatively large moment of inertia as compared to a solid beam of the same mass for example. The moment of inertia is a gage of the bending resistance for a section under transverse loading. One method of optimizing bending resistance of a box beam without increase in weight is to increase the section depth while thinning wall size. However, increasing stresses at the outer surfaces and lessening resistance to buckling as the section depth increases requires the use of higher strength materials. Increasing the section depth also moves the outer surface of the end wall further inward with respect to the frame representing an potential encroachment on the print area of the supported screen. The prestressing methods of the present invention provide an alternative method of increasing bending stiffness for a section without significant increase in section depth.

A surface 513 of the secondary member 510 is brought into contact with an outer surface 515 of end wall 504 such that the secondary member 510 extends along substantially the entire length of the support member 500. The secondary member 510 and is affixed to the support member by welding along opposite sides of the secondary member 510 to form a composite structure 511. The welding could alternatively be continuous or discontinuous along the length of the secondary member. The distances from the centroidal axis $X_T$ of the secondary member 510 to the opposite outer surfaces 513, 517 of the secondary member is relatively small. The shallow cross section of secondary member 510 results in a relatively low moment of inertia for the secondary member 510 in comparison to the support member 500. The secondary member therefore is flexible and, separately, can be deflected without developing significant strains in comparison with the support member 500.

Figure 22A:
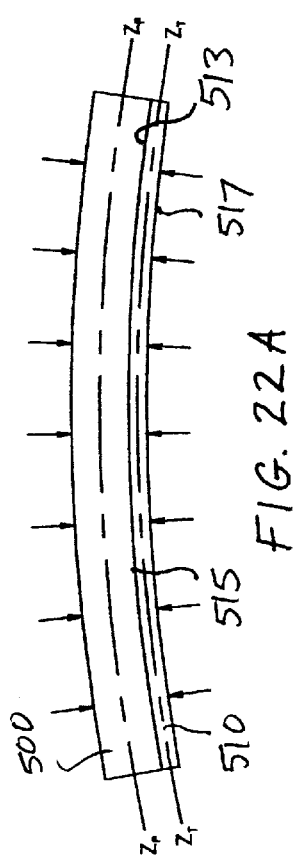
Figure 23A:
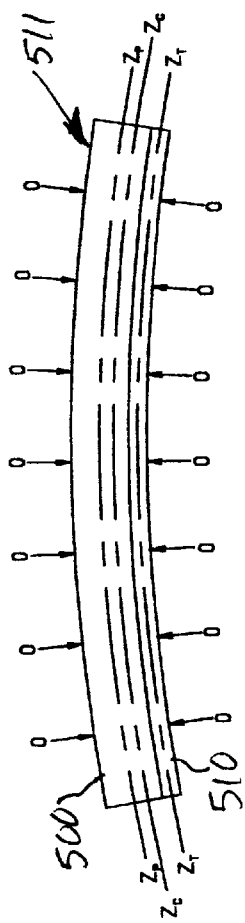
Figure 22B:
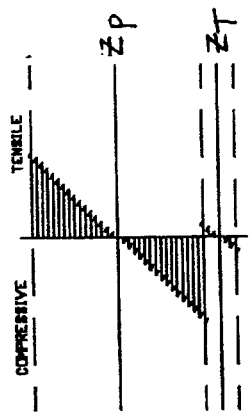
Figure 23B:
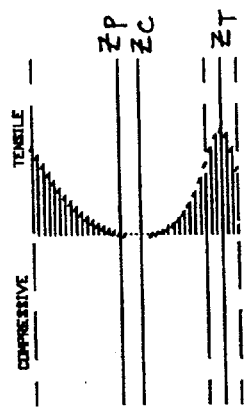

The applied loading and the resulting equal deflections of the support member 500 and the secondary member 510 prior to affixation is shown schematically in FIG. 22A. The resulting shear diagram associated with the loading condition of FIG. 22A is shown in FIG. 22B. The centroidal axes projected along the Z-axis are identified in FIG. 22 as $Z_P$, $Z_T$ and $Z_C$, respectively, for the support member 500, the secondary member 510 and the composite 511. It should be noted that the shear diagrams shown in FIG. 22B–26B assume a uniform solid cross section for simplicity and therefore should not be considered as representing a true shear diagram for the box section of support member 500 or for the composite 511. However, the shear diagram substantially represents the relative strain conditions for the box section and the composite sufficient for purposes of the following description.

As previously described, the primary intended function of a support member, such as the support member of FIGS. 22–26, is to resist inward deflection of an edge of a tensioned screen. In a deflected state in which the support member is deflected inwardly of a neutral condition toward the interior print area of a print screen, the end wall, such as end wall 504 of the box section of support member 500, will be in the tension carrying portion of the section. The affixation of secondary member 510 therefore has the effect of increasing the tensile capacity of the resulting composite section by increasing the amount of material in the region of end wall 504. However, the manner in which the secondary member 510 is affixed according to the present invention serves to prestress the support member 500 and increase the stiffness of the support member 500 beyond that which would result from merely increasing the thickness of the end wall 504.

Referring to FIGS. 22–26, one method of affixing the secondary member 510 to the support member 500 under imposed differential strains according to the present invention is described as well as the resulting response of the composite 511 to subsequent loading. Prior to affixation, the separate support member 500 and secondary member 510 are each placed under an applied load to create equal transverse deflection as illustrated schematically in FIG. 22A. The resulting relative strains are shown in FIG. 22B. As described previously, the strains imposed on the lower moment of inertia secondary member 510 are insignificant in comparison to those imposed on the support member 500. As also shown in FIG. 22B, the strain imposed on surface 513 of secondary member 510 is different from the strain imposed on surface 515 of support member 500. Specifically, a relatively large compressive strain is imposed on the contacting surface 515 of support member 500 while a relatively small tensile strain is imposed on the contacting surface 513 of secondary member 510.

The prestressing of support member 500 by secondary member 510 results from affixing the secondary member 510 to the support member 500 while both are maintained in the deflected condition. Following affixation of the secondary member 510, the loading which was imposed to deflect the secondary member 510 and the support member 500 by an equal amount is removed. The releasing compressive strains on the contacting surface of support member 500 places a corresponding tensile strain on the secondary member 510 which results in an equilibrium condition, illustrated schematically in FIG. 23A, in which the composite structure 511 is cambered outwardly with respect to a support member 500 positioned in a screen support frame. As shown in the associated shear diagram of FIG. 23B, the equilibrium condition associated with the cambered composite 511 results in tensile strains in both the flange 502 and the secondary member 510. It should be noted that the shape of the cambered composite structure may not necessarily take the form of the uniform radius arc shown. However, the outward cambering taking any form will serve to increase the performance of the composite structure under transverse loading in the manner to be described.

Referring to FIGS. 24–26, the condition of the composite 511 under transverse loading, such as applied by a tensioned screen for example, is illustrated. FIG. 24A illustrates an initial loading condition in which the camber has been reduced but the composite has not reached a neutral deflection. The associated shear diagram is shown in FIG. 24B. FIG. 25A illustrates the composite under loading sufficient to place the composite in a neutral deflection. The associated shear diagram is shown in FIG. 25B. In this condition, there will be no strain imposed on the flange 502 of support member 500 while the secondary member will experience a generally uniform tensile loading throughout its thickness. Finally, FIG. 26A illustrates further loading which is sufficient to create an inward camber on the composite with respect to a support member 500 when positioned in a screen frame. The associated shear diagram is shown in FIG. 26B. In this condition, as shown in FIG. 26B, the flange 502 will now carry compressive loading. The springrate of the composite 511 change non-linearly under the above-described loading. The springrate will increase sharply as the composite is deflected past the neutral condition shown in FIGS. 25A and 25B and the flange 502 begins to carry compressive loading. This is distinct from the previously described prestressed support members having arcuately configured tension cables for which a deflection past the neutral deflection will not result in such an increase in springrate. This results because the presence of the cable ends in the region of the roller supporting flange which was required for creating the cambering now tends to aid further deflection of the support member thereby offsetting the effect on springrate of the compression on carried by the flange.

Figure 28:
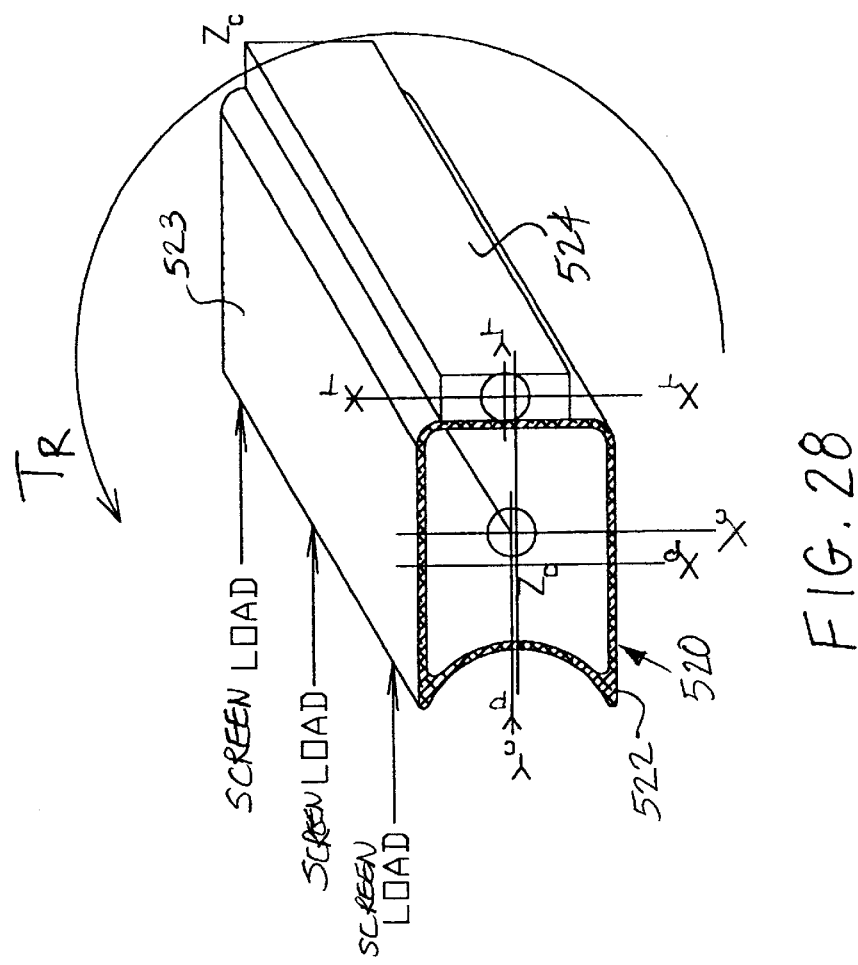
FIG. 28 is a perspective view of frame member according to an embodiment of the present invention.

Referring to FIG. 28, a composite 520 has a box section support member 522 and a secondary member 524 which was affixed to the support member 522 under differential strains in a deflected condition in the manner described previously to prestress the support member 500. The composite 520 differs from the composite 511 described previously in that the y-axis centroid, $Y_T$, of the affixed secondary member 524 is offset laterally with respect to the y-axis centroid, $Y_P$, of the support member 522. When the composite 520 is fixed at its ends, as by coupling in a frame, and is subjected to transverse bending, such as from forces applied by a tensioned screen, the composite develops a reaction torque, identified as $T_R$, acting about the longitudinal axis of the composite. The reaction torque which develops under deflection of the end-held composite varies as a function of the deflection and is created by the lateral offset. The reaction torque beneficially counters torque which is applied to the composite by the tensioned screen, identified in FIG. 27 as $T_A$. The applied torque results by virtue of the screen forces, identified by arrows in FIG. 27, being applied at a lateral side 523 of the support member 522 and therefore offset with respect to the centroid of the composite. The described affixation in a deflected condition for the offset secondary 524 will result in a twisting of the composite as the imposed deflection is released. However, the secondary 524 may be affixed to the support member 522 while in a deflected and twisted condition such that upon release following affixation, the twisting associated with the offset position of the secondary 524 will return the composite 520 to an untwisted condition. Subsequent deflection of the composite 520 will develop in the composite a reaction torque similar to that described previously by virtue of the offset position of the secondary 524 with respect to the support member 522.

Figure 29:
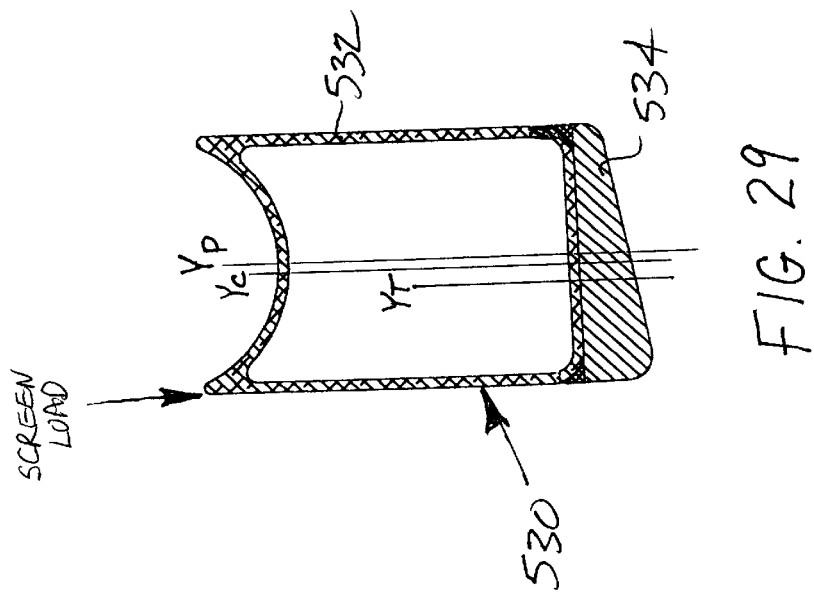
FIG. 29 is a sectional view of a secondary member for a frame member according to an embodiment of the present invention.

Referring to FIG. 29, a composite 530, shown in cross section, has a box section support member 532 and a secondary member 534 which was affixed under differential strains in a deflected condition in a similar manner to that previously described. The secondary member 534 has a cross section which is nonsymmetrical. The non-symmetry of the secondary member section results in a lateral offset of the y-axis centroid, $Y_T$ for the secondary member 534 from y-axis centroid, $Y_P$, of the support member 532. This offset provides for development of a reaction torque upon deflection similar to that described previously for composite 520.

Figure 30:
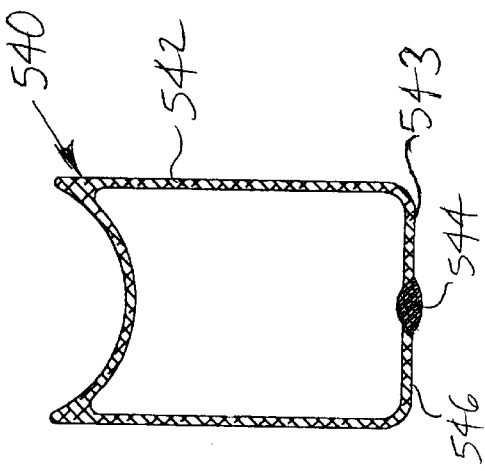
FIG. 30 is a sectional view of a frame member according to an embodiment of the present invention.

Referring to FIG. 30 there is shown a composite member 540 having a support member 542 and a secondary member 544. The secondary member consists of a weldment placed on the end wall 543 of the support member 542. Prior to placement of the secondary member 544, the support member 542 is deflected to impose a compressive strain on the outer surface 546 of the end wall 543. Following placement of the secondary member weldment 544 and release of the imposed deflection, the secondary member 544 will impose a prestress and/or cambering of the support member 542 in the manner described previously with respect to composite 511. It is conceivable that shrinkage of the secondary member weldment 544 as it cools, for example, could also impose a prestress on the support member 542.

Figure 31A:
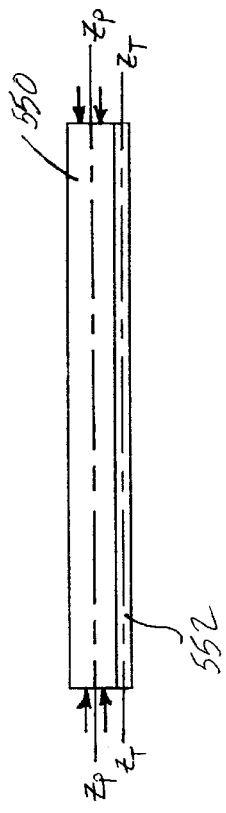
FIG. 31A is a schematic of a frame member and secondary member in which the frame member is compressed axially prior to affixation.
Figure 31B:
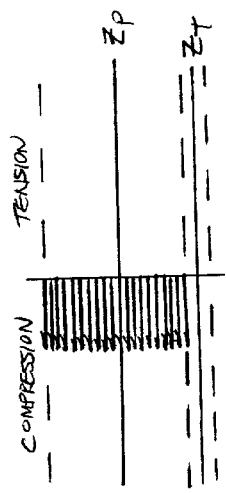
FIG. 31B is a shear diagram illustrating the strains associated with FIG. 31A.

Referring to FIGS. 31A and 311B, there is shown an alternative type of imposed condition resulting in differential strains on a support member 550 and a secondary member 552 according to the present invention. Instead of loading of both members for equal transverse deflections, the support member 550 is placed under axial loading, shown by arrows in FIG. 31A, to cause a substantially uniform compressive strain throughout the support member 550, as shown in FIG. 31B. As also shown in FIG. 31B, the secondary member 552 is not strained prior to affixation. After affixation and release of the imposed conditions, the releasing strain from support member 550 will be restrained by the affixed secondary member 552 thereby applying a prestress to the support member 550.

While the various composites of FIGS. 19–31 were formed under imposed conditions created by applied loading, it is conceivable that other methods could be used to impose differential strains on the support member and the secondary member prior to affixation. For example, it is conceivable that differential heating or cooling of the members could be utilized to expand or contract one of the members with respect to the others prior to affixation. Following affixation, the releasing strain as the members return to an equilibrium temperature would result in prestress.

The various composites of FIGS. 19–31 each involved a prestressing secondary member affixed to the outer surface the end wall of the box section support member to serve as a tension carrying member. It is conceivable that such a tension carrying secondary member could be affixed to the inside surface of the end wall. Furthermore, it is conceivable that a prestressing secondary member be affixed to the inside or outside surface of the flange of a box section, such as flange 502 of support member 500, in which case the secondary member would act serve as a compression carrying member. It is also conceivable that a secondary member be affixed to one or both of the webs of a deflected box section in which case the secondary member would act as a shear carrying member.

Referring to FIG. 32, there is shown a composite 560 according to the present invention having a support member 562 reinforced by secondary members 564, 566. The secondary members 564, 566 have been affixed by encapsulation, through crimping for example, within the end wall 568 of support member 562. This-is distinct from the previously described composites in which the secondary member was affixed to a surface of the support member.

Figure 33:
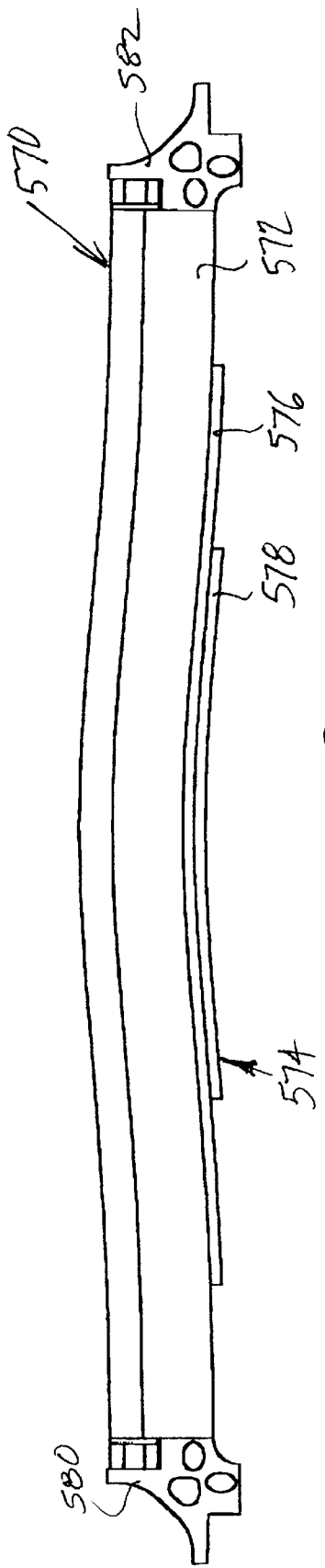
FIG. 33 is a plan view of a frame member according to an embodiment of the present invention.

Referring to FIG. 33, there is shown a composite 570 according to the present invention having a support member 572 reinforced by a laminate 574 of secondary members 576 and 578. The composite is shown supported between corner members 580, 582 and outwardly cambered by the laminate reinforcement member 574. The laminate 574 is formed by imposing an applied condition, such as a loading condition shown in FIG. 22A, which creates differential strains on confronting surfaces of the support member 572 and secondary member 576. Secondary member 576 is affixed to the support member while the applied condition is maintained. Thereafter the additional secondary member 578 is affixed to the secondary member 576 while the applied condition is maintained to form the laminate 578. The applied condition is then removed so that the releasing strains apply prestress to the support member 572.

The various embodiments of the present invention have been described with reference to a roller frame 10 having corner members. It is contemplated, however, that other types of screen printing frames may be used. For example, it is contemplated that the support members 42, 44, 46 and 48 may be connected together to form a stretch and glue frame. In this type of embodiment, four support members will be used. Each support member may be hollow, and include two ends, a longitudinal axis, and an interior space defined by an end wall. A reinforcing member providing prestress for the support member in accordance with the present invention would be associated with at least one of the support members. It is further contemplated that each support member be mitered so that each support member is connected directly to adjoining members each other by a bolt and nut combination or other means. It is further contemplated that the ends of the support member be coupled together through welding, with or without an intermediate corner member.

Twist and/or camber created by the reinforcing structure associated with the support members or with a roller can be used to at least partially counteract the effects of gravity on the frame in addition to the bending of these structures when the printing screen is place under tension and/or in use during printing. Screens having support members of a length of 6–25 feet are not uncommon, and can exceed 25 feet. As such a frame is raised, the longer sides of the frame have a tendency to sag due to the weight of the frame alone. By placing an initial camber to the support members, the bowing due to gravity may be countered to provide a more stable and flatter frame.

Another advantage that may be created by the present invention is that each support member may be set with a separate prestress or camber. Furthermore the individual support member may also be shipped separately and the overall frame assembled on site. The ability to ship the individual support members separately results in significant savings in shipping costs.

While the present invention has been described in connection with the preferred embodiments of the various figures, it is to be understood that other embodiments may be used or modifications and additions made to the described embodiments for performing the same function of the present invention without deviating therefrom. Therefore, the present invention should not be limited to any single embodiment, but rather construed in breadth and scope in accordance with the recitation of the appended claims.

We claim:

1. A frame for supporting the screen of a screen printing machine, said frame comprising:
   a plurality of elongated frame members having opposite ends, each of the ends operably secured to one of the ends of an adjacent frame member such that said frame members are coupled together; and
   a reinforcing member extending in intimate proximity to one of said frame members, the reinforcing member secured to the frame and axially stressed such that a prestress or camber is applied to said frame member, the prestressing or cambering of said frame member by said reinforcing member limiting deflection of said frame member resulting from loads applied to the frame by a tensioned screen.

2. The frame according to claim 1, wherein said frame member includes at least two spaced apart and longitudinally extending portions each defining one side of an interior therebetween, and wherein said reinforcing member includes a cable extending within the interior of said frame member, said cable having opposite ends extending beyond bearing surfaces of said frame, said reinforcing member further including at least one tensioner attached to said cable adjacent one of said ends and adapted to tension said cable between said bearing surfaces.

3. The frame according to claim 2, wherein said frame member is a roller of a screen tensioning frame, said tensioning frame including a plurality of coupled rollers each rotatably supported between connecting members and retaining an edge of said screen to tension said screen upon rotation of said rollers, each of said rollers consisting of a hollow cylinder.

4. The frame according to claim 2, wherein said frame is a roller frame having a plurality of coupled rollers each rotatably supported between connecting members and retaining an edge of said screen to tension said screen upon rotation of said rollers, and wherein said frame members are support members each supported by said frame to extend adjacently to one of said rollers for additional support of an edge of said screen.

5. The frame according to claim 2, wherein said frame includes at least one cable support supported by said frame member and located between the bearing surfaces of said frame, said cable support slidably retaining said cable at a preselected transverse position with respect to said frame member such that a non-linear configuration of said cable is established for cambering of said frame member upon tensioning of said cable.

6. The frame according to claim 5, wherein said frame includes a plurality of cable supports retaining said cable at varying transverse positions with respect to said frame member such that said non-linear configuration is a generally arcuate configuration.

7. The frame according to claim 5, wherein said cable support includes a pin member supported by said frame member, said pin member including an eyelet located at said preselected transverse position through which said cable extends.

8. The frame according to claim 5, wherein said cable support includes a cable support plate supported by said frame member and extending substantially between the opposing longitudinal surfaces of said frame member, said plate member including an opening at said preselected transverse position with respect to said frame member through which said cable extends.

9. The frame according to claim 2, wherein said frame includes a pair of cables, said cables spaced from each other such that differential tensioning of said cables results in cambering of said frame member.

10. The frame member according to claim 2, wherein said flame includes a plurality of connectors coupling said frame members together to form said at least a portion of said frame such that each of said connectors is connected to an end of two of said frame members, and wherein each of said bearing surfaces is defined by one of said connectors.

11. The frame according to claim 2, wherein said frame includes a plurality of connectors coupling said frame members together such that each of said connectors is connected to an end of two of said frame members, said frame further including a plurality of attachment bolts each extending through openings in one of said connectors and engaging an end of one of said frame members, and wherein each of said bearing surfaces is defined by one of said attachment bolts.

12. The frame according to claim 2, wherein said frame member includes a flange and an opposite end wall connected by spaced apart and generally parallel webs defining an interior of said frame member, and wherein said frame member includes end caps each located at an end of said frame member such that said interior is enclosed by said end caps, each of said end caps defining one of said bearing surfaces.

13. The frame according to claim 1, wherein said reinforcing member is secured to said frame member by affixing said reinforcing member to a surface of said frame member along at least one longitudinally extending portion of the reinforcing member.

14. The frame according to claim 13 wherein said reinforcing member and said frame member have centroidal axes, and wherein the centroidal axis of said reinforcing member is laterally offset with respect to the centroidal axis of said frame member.

15. The frame according to claim 14, wherein said reinforcing member has a non-symmetrical cross section to provide lateral offset between said centroidal axes.

16. The frame according to claim 13, wherein the reinforcing member is secured to the frame member by adhesion.

17. The frame according to claim 1, wherein the reinforcing member is secured to the frame member by affixing the reinforcing member to a surface of the frame member, the affixing of the reinforcing member resulting in substantial encapsulation of at least a portion of the reinforcing member by a portion of the frame member.

18. The frame according to claim 17, wherein the reinforcing member is secured to the frame member by crimping the portion of the frame member around the reinforcing member.

19. The frame according to claim 1, wherein the reinforcing member is secured to the frame member by crimping a portion of the frame member to the reinforcing member.

20. A frame for supporting the screen of a screen printing machine, said frame comprising:
   a plurality of elongated frame members coupled together to form at least a portion of said frame, each of said frame members operably supporting an edge of said screen; and
   at least one reinforcing member for at least one of said frame members, said reinforcing member supported by said frame to extend in intimate proximity to said frame member along at least a portion of said frame member such that said reinforcing member applies either one of or both a prestress and camber to said frame member, said reinforcing member including at least one elongated secondary member extending along at least a portion of said frame member and affixed along at least a portion of its length to said frame member, said frame member and said secondary member having been affixed while an applied condition imposed differential strains on said frame member and said secondary member, said differential strains resulting in said either one of or both a prestress and camber to said frame member following affixation and removal of said applied condition, and at least one additional secondary member affixed to said secondary member to form a laminate of secondary members, said additional secondary member being affixed to said secondary member while said applied condition is maintained.

21. A frame for supporting a screen for use in a screen printing machine, the frame comprising:

a plurality of elongated frame members coupled together at ends thereof; and an elongated secondary member secured to one of the elongated frame members by affixing the secondary member to a surface of the frame member along at least one longitudinally extending portion of the secondary member, the secondary member being axial stressed such that a prestress or camber is applied to the franc member, the prestressing or cambering of said frame member by said secondary member limiting deflection of said frame member resulting from loads applied to the frame by a tensioned screen.

22. A frame for supporting a screen for use in a screen printing machine, the frame comprising:

a plurality of elongated frame members coupled together at ends thereof; and at least one secondary member having a surface that contacts a surface of one of the elongated frame members, the secondary member welded to the elongated frame member along at least one longitudinally extending portion of the secondary member, the welding of the secondary member to the frame member occurring while a temporary axial strain is induced at the surface of at least one of the secondary member and the frame member such that removal of the axial strain following the welding results in a prestress or camber of the frame member.

23. The screen support frame according to claim 22, wherein the secondary member consists of an elongated weldment having a cross sectional area placed on one of the frame members.

24. A frame for supporting the screen of a screen printing machine, the frame comprising:

a plurality of elongated frame members each having opposite ends;

corner members each located between a pair of the elongated frame members, the plurality of frame members coupled to the associated corner members at the ends thereof; and an elongated prestressing member extending in intimate proximity to one of said frame members, the prestressing member engaging either the frame member or the corner members secured to the frame member such that the prestressing member is axially stressed to apply a prestress or camber to the frame member, the prestressing or cambering of the frame member by the prestressing member limiting deflection of the frame member resulting from loads applied to the frame by a tensioned screen.

25. The frame according to claim 24, wherein the frame members are bolted at their ends to the associated corner members to form the coupling therebetween.

26. The frame according to claim 24, further comprising a plurality of elongated rollers each rotatably supported and adapted to retain an edge of a screen and tension the screen by rotation of the rollers, the rollers being operatively coupled at their ends to associated corner members, each of the elongated frame members forming a roller support extending adjacent one of the rollers to limit deflection of the roller upon tensioning of the screen.

27. The frame according to claim 26, wherein each of the frame members is a beam having an arcuate roller support wall positioned adjacent the associated roller and an opposite end wall connected to the roller support wall by at least one web.

28. A frame for supporting the screen of a screen printing machine, the frame comprising:

a plurality of elongated frame members each having opposite ends;

corner members each located between a pair of the elongated frame members, the plurality of frame members coupled to the associated corner members at the ends thereof;

a plurality of elongated rollers each rotatable supported and adapted to retain an edge of a screen and tension the screen by rotation of the rollers, the rollers being operatively coupled at their ends to associated corner members, each of the elongated frame members comprising a beam having an arcuate roller support wall positioned adjacent the associated roller to limit deflection of the roller upon tensioning of the screen, the beam further having an opposite end wall connected to the roller support wall by at least one web; and an elongated secondary member secured to the end wall of one of the roller support beams by welding the secondary member to the end wall such that the secondary member is axially stressed to apply a prestress or camber to the roller support beam.

29. The frame according to claim 28, wherein the elongated secondary member consists of a weldment having a cross sectional area placed on the end wall of the beam.

* * * * *

UNITED STATES PATENT AND TRADEMARK OFFICE
CERTIFICATE OF CORRECTION

PATENT NO. : 6,732,640 B1
DATED : May 11, 2004
INVENTOR(S) : Newman et al.

It is certified that error appears in the above-identified patent and that said Letters Patent is hereby corrected as shown below:

Column 1,
Line 55, after "screen" and before "reduced", change "in" to -- is --.

Column 2,
Line 10, after "referred to" and before "a", insert -- as --.
Line 41, after "torsional deflections", change "are" to -- is --.
Line 42, after "undesirable", change "increases" to -- increase --.
Line 47, change "SUMMARY IF THE INVENTION" to -- SUMMARY OF THE INVENTION --.

Column 3,
Line 2, after "secondary member", delete "while the members".
Line 3, after "applied condition", change "imposed" to -- imposes --.

Column 5,
Line 61, after "significant delay", change "are" to -- is --.

Column 6,
Line 10, after "opposite sides", insert -- of --.

Column 7,
Line 38, before "inwardly toward", change "projects" to -- , the steps projecting --.
Line 39, before "peripheral notches", change "include" to -- includes --.
Line 48, after "cable support", change "plate" to -- plates --.
Line 60, after "positions on the support", change "plate" to -- plates --.

Column 8,
Line 58, after "extending through", delete "an".

Column 10,
Line 29, after "inertia is a", change "gage" to -- gauge --.
Line 38, after "representing". change "an" to -- a --.
Line 47, after "member 510", delete "and".
Line 54, before "relatively small", change "is" to -- are --.

Column 12,
Line 17, before "non-Linearly", change "change" to -- changes --.
Line 29, after "compression" and before "carried", delete "on".

UNITED STATES PATENT AND TRADEMARK OFFICE
CERTIFICATE OF CORRECTION

PATENT NO.    : 6,732,640 B1
DATED         : May 11, 2004
INVENTOR(S)   : Newman et al.

It is certified that error appears in the above-identified patent and that said Letters Patent is hereby corrected as shown below:

Column 13,
Line 47, after "FIGS. 19-31 each", change "involved" to -- involves --.
Line 56, after "would act", delete "serve".
Line 58, after "member" and before "be affixed", insert -- could --.
Line 67, before "distinct from", change "This-is" to -- This is --.

Column 14,
Line 34, after "adjoining members", delete "each other".
Line 43, after "screen is", change "place" to -- placed --.

Column 18,
Line 37, after "each" and before "supported", change "rotatable" to -- rotatably --.

Signed and Sealed this

Fifth Day of April, 2005

JON W. DUDAS
*Director of the United States Patent and Trademark Office*